(12) United States Patent
Kataoka et al.

(10) Patent No.: US 9,509,333 B2
(45) Date of Patent: Nov. 29, 2016

(54) COMPRESSION DEVICE, COMPRESSION METHOD, DECOMPRESSION DEVICE, DECOMPRESSION METHOD, INFORMATION PROCESSING SYSTEM, AND RECORDING MEDIUM

(71) Applicant: FUJITSU LIMITED, Kawasaki-shi, Kanagawa (JP)

(72) Inventors: Masahiro Kataoka, Kamakura (JP); Masanori Sakai, Mishima (JP); Takafumi Ohta, Shinagawa (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/857,553

(22) Filed: Sep. 17, 2015

(65) Prior Publication Data
US 2016/0006454 A1    Jan. 7, 2016

Related U.S. Application Data

(63) Continuation of application No. PCT/JP2013/001976, filed on Mar. 22, 2013.

(51) Int. Cl.
| | | |
|---|---|---|
| *H03M 7/30* | (2006.01) | |
| *G06F 17/22* | (2006.01) | |
| *G06F 17/30* | (2006.01) | |

(52) U.S. Cl.
CPC ............ *H03M 7/30* (2013.01); *G06F 17/2252* (2013.01); *G06F 17/30153* (2013.01); *H03M 7/3088* (2013.01); *H03M 7/705* (2013.01)

(58) Field of Classification Search
CPC .................................................... H03M 7/30
USPC ............................................. 341/87, 50, 51
See application file for complete search history.

(56) References Cited

U.S. PATENT DOCUMENTS 5,590,317 A     12/1996  Iguchi et al.
5,710,919 A *   1/1998   Rail .................. G06F 17/30595
                                                                341/52
(Continued)

FOREIGN PATENT DOCUMENTS

EP     0 584 992 A2    3/1994
EP     0 584 992 A3    3/1994
(Continued)

OTHER PUBLICATIONS

International Search Report issued Jun. 18, 2013 in PCT/JP2013/001976 filed Mar. 22, 2013, with English translation.

(Continued)

*Primary Examiner* — Jean B Jeanglaude
(74) *Attorney, Agent, or Firm* — Oblon, McClelland, Maier & Neustadt, L.L.P.

(57) ABSTRACT

A compression device includes a processor configured to execute a process. The process includes: storing, in a storage, a first compressed code in association with a first element, the first compressed code corresponding to a combination of a first element and a first delimiter, the first element being one of a plurality of elements constituting input data, the first delimiter being one of delimiters delimiting the plurality of elements and succeeding the first element in the input data; acquiring, from the storage, the first compressed code in response to reading a sequence of the first element and the first delimiter from the input data; and writing the first compressed code into a storage area that stores therein compressed data of the input data.

25 Claims, 22 Drawing Sheets

(56) References Cited

U.S. PATENT DOCUMENTS

| | | | |
|---|---|---|---|
| 6,047,298 A | | 4/2000 | Morishita |
| 8,554,745 B2* | | 10/2013 | Pawar ................ G06F 12/0804 707/638 |
| 2002/0029206 A1 | | 3/2002 | Satoh et al. |
| 2002/0065822 A1* | | 5/2002 | Itani ........................ H03M 7/30 |
| 2002/0091886 A1* | | 7/2002 | Meulenbroeks .... H03M 7/3086 710/100 |
| 2010/0085222 A1 | | 4/2010 | Kataoka et al. |
| 2013/0024433 A1* | | 1/2013 | Amit ....................... H03M 7/30 707/693 |
| 2014/0081929 A1* | | 3/2014 | Pawar ................ G06F 12/0804 707/693 |

FOREIGN PATENT DOCUMENTS

| | | |
|---|---|---|
| JP | 04-167821 A | 6/1992 |
| JP | 05-324427 A | 12/1993 |
| JP | 09-212395 A | 8/1997 |
| JP | 11-168390 A | 6/1999 |
| JP | 11-177438 A | 7/1999 |
| JP | 2000-022552 A | 1/2000 |
| JP | 3553106 B2 | 8/2004 |
| JP | 2010-093414 A | 4/2010 |
| WO | WO 85/01814 A1 | 4/1985 |
| WO | WO 98/40969 A2 | 9/1998 |
| WO | WO 98/40969 A3 | 9/1998 |

OTHER PUBLICATIONS

Written Opinion issued Jun. 18, 2013 in PCT/JP2013/001976 filed Mar. 22, 2013, with partial English translation.
Office Action issued on Jun. 21, 2016 in Korean Patent Application No. 10-2015-7025611 (with English language translation).
Extended European Search Report issued on Apr. 29, 2016 in Patent Application No. 13879073.8.
K.S. NG, et al., "Dynamic Word Based Text Compression", Proceedings of the 4th International Conference on Document Analysis and Recognition, XP010244749, 1997, pp. 412-416.
Office Action mailed Sep. 14, 2016 in Australian Patent Application No. 2013382910.

* cited by examiner

FIG.1

| CHARACTER/ WORD | COMPRESSED CODE | | CHARACTER/ WORD/ CONTROL SYMBOL | COMPRESSED CODE | |
|---|---|---|---|---|---|
| a | c' (a) | | a | c (a) | |
| ⋮ | ⋮ | | ⋮ | ⋮ | |
| z | c' (z) | | z | c (z) | |
| A | c' (A) | D01 | A | c (A) | D11 |
| ⋮ | ⋮ | | ⋮ | ⋮ | |
| Z | c' (Z) | | Z | c (Z) | |
| Δ | c' (Δ) | | Δ | c (Δ) | |
| . | c' (.) | | . | c (.) | |
| ⋮ | ⋮ | | ⋮ | ⋮ | |
| about | c' (about) | | aboutΔ | c (aboutΔ) | |
| ⋮ | ⋮ | D02 | ⋮ | ⋮ | D12 |
| invention | c' (invention) | | inventionΔ | c (inventionΔ) | |
| ⋮ | ⋮ | | ⋮ | ⋮ | |
| | | | [-Δ]: | c ([-Δ]:) | |
| | | | [-Δ]; | c ([-Δ];) | D13 |
| | | | [-Δ], | c ([-Δ],) | |
| | | | [-Δ]. | c ([-Δ].) | |
| | | | ⋮ | ⋮ | |

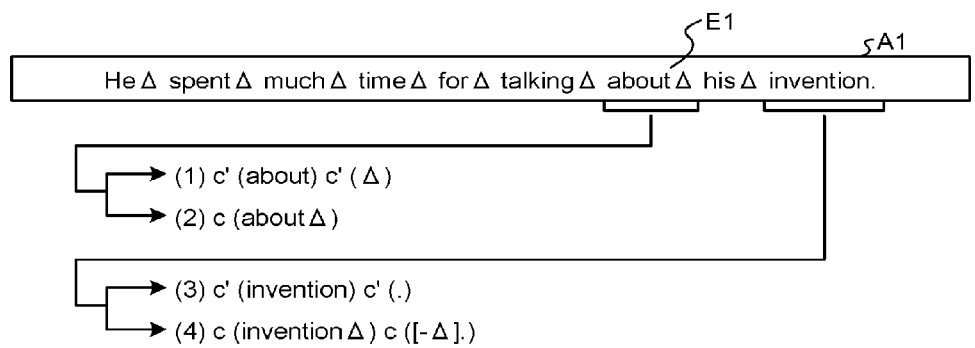

HeΔ spentΔ muchΔ timeΔ forΔ talkingΔ aboutΔ hisΔ invention.   (E1, A1)

(1) c' (about) c' (Δ)
(2) c (aboutΔ)
(3) c' (invention) c' (.)
(4) c (inventionΔ) c ([-Δ].)

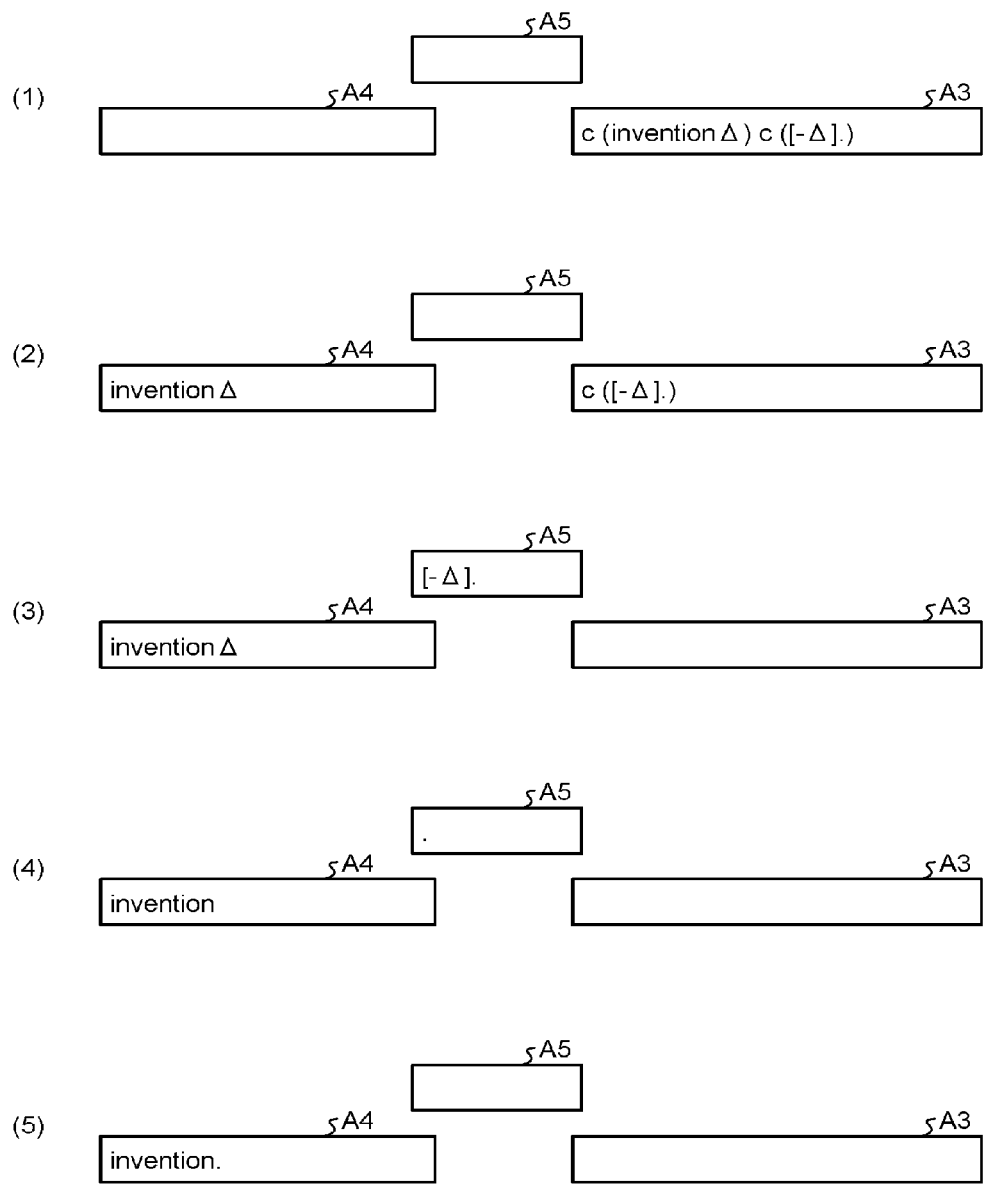

FIG.8

| CHARACTER/WORD/<br>CONTROL SYMBOL | NUMBER OF<br>APPEARANCE |
|---|---|
| a | ... |
| a△ | ... |
| aboard△ | ... |
| abound△ | ... |
| about△ | ... |
| ⋮ | ⋮ |
| invent△ | ... |
| invention△ | ... |
| inventive△ | ... |
| ⋮ | ⋮ |
| [-△]: | ... |
| [-△]; | ... |
| [-△], | ... |
| [-△]. | ... |
| ⋮ | ⋮ |

FIG.11

|  | CHARACTER INFORMATION | COMPRESSED CODE |
|---|---|---|
| 0x0000 | a | c(a) |
| 0x0001 | aΔ | c(aΔ) |
| 0x0002 | aboardΔ | c(aboardΔ) |
| 0x0003 | aboundΔ | c(aboundΔ) |
| 0x0004 | aboutΔ | c(aboutΔ) |
| ⋮ | ⋮ | ⋮ |
| 0x0140 | inventΔ | c(inventΔ) |
| 0x0141 | inventionΔ | c(inventionΔ) |
| 0x0142 | inventiveΔ | c(inventiveΔ) |
| ⋮ | ⋮ | ⋮ |
| 0x03F0 | [-Δ]: | c([-Δ]:) |
| 0x03F1 | [-Δ]; | c([-Δ];) |
| 0x03F2 | [-Δ], | c([-Δ],) |
| 0x03F3 | [-Δ]. | c([-Δ].) |
| ⋮ | ⋮ | ⋮ |

| | DECOMPRESSION CODE (CHARACTER INFORMATION) | CODE LENGTH |
|---|---|---|
| ⋮ | ⋮ | ⋮ |
| c ([-Δ].)+00000 → 0x0160 | [-Δ]. | 7 |
| 0x0161 | [-Δ]. | 7 |
| ⋮ | ⋮ | ⋮ |
| 0x17F | [-Δ]. | 7 |
| ⋮ | ⋮ | ⋮ |
| c (aboutΔ)+00 → 0x6A4 | aboutΔ | 10 |
| 0x6A5 | aboutΔ | 10 |
| 0x6A6 | aboutΔ | 10 |
| 0x6A7 | aboutΔ | 10 |
| ⋮ | ⋮ | ⋮ |
| c (inventionΔ)+0 → 0xA8C | inventionΔ | 11 |
| 0xA8D | inventionΔ | 11 |
| ⋮ | ⋮ | ⋮ |
| 0xFFF | ... | 12 |

| | CHARACTER/WORD/<br>CONTROL SYMBOL | COMPRESSED CODE |
|---|---|---|
| 0x0000 | a | c (a) |
| 0x0001 | aΔ | c (aΔ) |
| 0x0002 | aboardΔ | c (aboardΔ) |
| 0x0003 | aboundΔ | c (aboundΔ) |
| 0x0004 | aboutΔ | c (aboutΔ) |
| ⋮ | ⋮ | ⋮ |
| 0x0140 | inventΔ | c (inventΔ) |
| 0x0141 | inventionΔ | c (inventionΔ) |
| 0x0142 | inventiveΔ | c (inventiveΔ) |
| ⋮ | ⋮ | ⋮ |
| 0x03F0 | [-Δ]:Δ | c ([-Δ]:Δ) |
| 0x03F1 | [-Δ];Δ | c ([-Δ];Δ) |
| 0x03F2 | [-Δ],Δ | c ([-Δ],Δ) |
| 0x03F3 | [-Δ].Δ | c ([-Δ].Δ) |
| ⋮ | ⋮ | ⋮ |
| 0x03FF | [-Δ] | c ([-Δ]) |
| ⋮ | ⋮ | ⋮ |

| | | | D5 |
|---|---|---|---|
| | | DECOMPRESSION CODE | CODE LENGTH |
| | | ⋮ | ⋮ |
| c ([-Δ].)+00000 → | 0x0160 | [-Δ].Δ | 7 |
| | 0x0161 | [-Δ].Δ | 7 |
| | ⋮ | ⋮ | ⋮ |
| | 0x17F | [-Δ].Δ | 7 |
| | ⋮ | ⋮ | ⋮ |
| c (aboutΔ)+00 → | 0x6A4 | aboutΔ | 10 |
| | 0x6A5 | aboutΔ | 10 |
| | 0x6A6 | aboutΔ | 10 |
| | 0x6A7 | aboutΔ | 10 |
| | ⋮ | ⋮ | ⋮ |
| c (inventionΔ)+0 → | 0xA8C | inventionΔ | 11 |
| | 0xA8D | inventionΔ | 11 |
| | ⋮ | ⋮ | ⋮ |
| | 0xC37 | [-Δ] | 12 |
| | ⋮ | ⋮ | ⋮ |
| | 0xFFF | ... | 12 |

APPLICATION NUMBER, APPLICATION DATE, INVENTOR,
COUNTRY NAME, ROUTE, TITLE OF INVENTION
H11-523696, 19981020, KATAOKA△ MASAHIRO, JP, PCT, FILE PROC···
2004-310655, 20041026, KATAOKA△ MASAHIRO, JP, PAR, INDEX GEN···
2007-516202, 20051128, KATAOKA△ MASAHIRO, JP, PCT, INFORMAT···
2007-512997, 20060410, KATAOKA△ MASAHIRO, JP, PCT, SEARCHIN···
2008-522222, 20060623, KATAOKA△ MASAHIRO, JP, PCT, DECOMPR···
2008-539647, 20061019, KATAOKA△ MASAHIRO, JP, PCT, INFORMAT···
2008-554930, 20070124, KATAOKA△ MASAHIRO, JP, PCT, INFORMAT···
2009-515067, 20070524, KATAOKA△ MASAHIRO, JP, PCT, INFORMAT···
2009-516306, 20080523, KATAOKA△ MASAHIRO, JP, PCT, INFORMAT···
2008-141734, 20080529, KATAOKA△ MASAHIRO, JP, PAR, SEARCHIN···
2008-143527, 20080530, KATAOKA△ MASAHIRO, JP, PAR, INFORMAT···
2008-259507, 20081006, KATAOKA△ MASAHIRO, JP, PAR, INFORMAT···
2009-254794, 20091106, KATAOKA△ MASAHIRO, JP, PAR, INFORMAT···
2009-296410, 20091225, KATAOKA△ MASAHIRO, JP, PAR, INFORMAT···
2012-517077, 20100528, KATAOKA△ MASAHIRO, JP, PCT, INFORMAT···
2011-081105, 20110331, KATAOKA△ MASAHIRO, JP, PAR, EXTRACTI···
2012-088862, 20120409, KATAOKA△ MASAHIRO, JP, PCT, INFORMAT···

FIG.23

| | CHARACTER/WORD/ CONTROL SYMBOL | COMPRESSED CODE |
|---|---|---|
| 0x0000 | A | c (A) |
| 0x0001 | A, | c (A,) |
| ⋮ | ⋮ | ⋮ |
| 0x011B | INDEX, | c (INDEX,) |
| 0x011C | INFORMATION, | c (INFORMATION,) |
| 0x011D | J | c (J) |
| 0x011E | JP, | c (JP,) |
| ⋮ | ⋮ | ⋮ |
| 0x012D | KALIUM, | c (KALIUM,) |
| 0x012E | KATAOKA, | c (KATAOKA,) |
| 0x012F | KATAYAMA, | c (KATAYAMA,) |
| ⋮ | ⋮ | ⋮ |
| 0x0176 | MASAHIRO, | c (MASAHIRO,) |
| ⋮ | ⋮ | ⋮ |
| 0x0291 | PAR, | c (PAR,) |
| 0x0292 | PCT, | c (PCT,) |
| 0x0293 | PROCESSING, | c (PROCESSING,) |
| ⋮ | ⋮ | ⋮ |
| 0x03F0 | [-,]Δ | c ([-,]Δ) |
| 0x03F1 | [-,][LF] | c ([-,][LF]) |
| 0x03F2 | [-,]" | c ([-,]") |
| 0x03F3 | [-,]. | c ([-,].) |
| ⋮ | ⋮ | ⋮ |
| 0x03FF | [-,] | c ([-, Δ]) |
| ⋮ | ⋮ | ⋮ |

| | DECOMPRESSION CODE | CODE LENGTH |
|---|---|---|
| ⋮ | ⋮ | ⋮ |
| c ([-,][LF])+00000 → 0x0120 | [-,][LF] | 7 |
| 0x0121 | [-,][LF] | 7 |
| ⋮ | ⋮ | ⋮ |
| 0x13F | [-,][LF] | 7 |
| ⋮ | ⋮ | ⋮ |
| c ([-,]△)+00 → 0x3A0 | [-,]△ | 8 |
| 0x3A1 | [-,]△ | 8 |
| ⋮ | ⋮ | ⋮ |
| 0x3AF | [-,]△ | 8 |
| ⋮ | ⋮ | ⋮ |
| c (KATAOKA,)+0 → 0xAF2 | KATAOKA, | 11 |
| 0xAF3 | KATAOKA, | 11 |
| ⋮ | ⋮ | ⋮ |
| 0xC37 | [-,] | 12 |
| ⋮ | ⋮ | ⋮ |
| 0xFFF | ... | 12 |

D7

US 9,509,333 B2

COMPRESSION DEVICE, COMPRESSION METHOD, DECOMPRESSION DEVICE, DECOMPRESSION METHOD, INFORMATION PROCESSING SYSTEM, AND RECORDING MEDIUM

CROSS-REFERENCE TO RELATED APPLICATION

This application is a continuation application of International Application PCT/JP2013/001976, filed on Mar. 22, 2013, and designating the U.S., the entire contents of which are incorporated herein by reference.

FIELD

The present invention relates to at least one of data compression and decompression techniques.

BACKGROUND

According to compression algorithms that use variable-length compressed codes, such as Huffman coding and arithmetic compression, compressed data is generated by using compressed codes corresponding to character codes in compression target data. There is also a compression technique in which a compression algorithm such as Huffman coding is used to assign compressed codes each correlated with a word, which is a combination of character codes, and generate compressed data (see Patent Document 1, for example).

Patent Document 1: Japanese Laid-open Patent Publication No. 2010-93414

In certain languages (English and German, for example), space symbols included in character strings that constitute a document represent breaks between words, which are units constituting the document. In the above-described compression algorithms, while a single compressed code is allocated to each word including a plurality of characters, a compressed code is also assigned to each space symbol. Because a compressed code is assigned to each space symbol equally to words, the number of compressed codes to be used for compression increases, causing the compression ratio to decrease.

SUMMARY

According to an aspect of the embodiments, a compression device includes: a processor configured to execute a process including: storing, in a storage, a first compressed code in association with a first element, the first compressed code corresponding to a combination of a first element and a first delimiter, the first element being one of a plurality of elements constituting input data, the first delimiter being one of delimiters delimiting the plurality of elements and succeeding the first element in the input data; acquiring, from the storage, the first compressed code in response to reading a sequence of the first element and the first delimiter from the input data; and writing the first compressed code into a storage area that stores therein compressed data of the input data.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is an example of a compression dictionary;
FIG. 2 is an example of conversion to compressed codes;
FIG. 3 is an example of conversion to decompressed data;
FIG. 8 is an example of a statistical table T1;
FIG. 11 is an example of a data structure of the compression dictionary;
FIG. 15 is an example of a data structure of the decompression dictionary;
FIG. 20 is an example of a data structure of a compression dictionary;
FIG. 21 is an example of a data structure of a decompression dictionary;
FIG. 22 is an example of a data structure in CSV format;
FIG. 23 is an example of a data structure of a compression dictionary;
and
FIG. 24 is an example of a data structure of a decompression dictionary.

DESCRIPTION OF EMBODIMENTS

Figure 4:
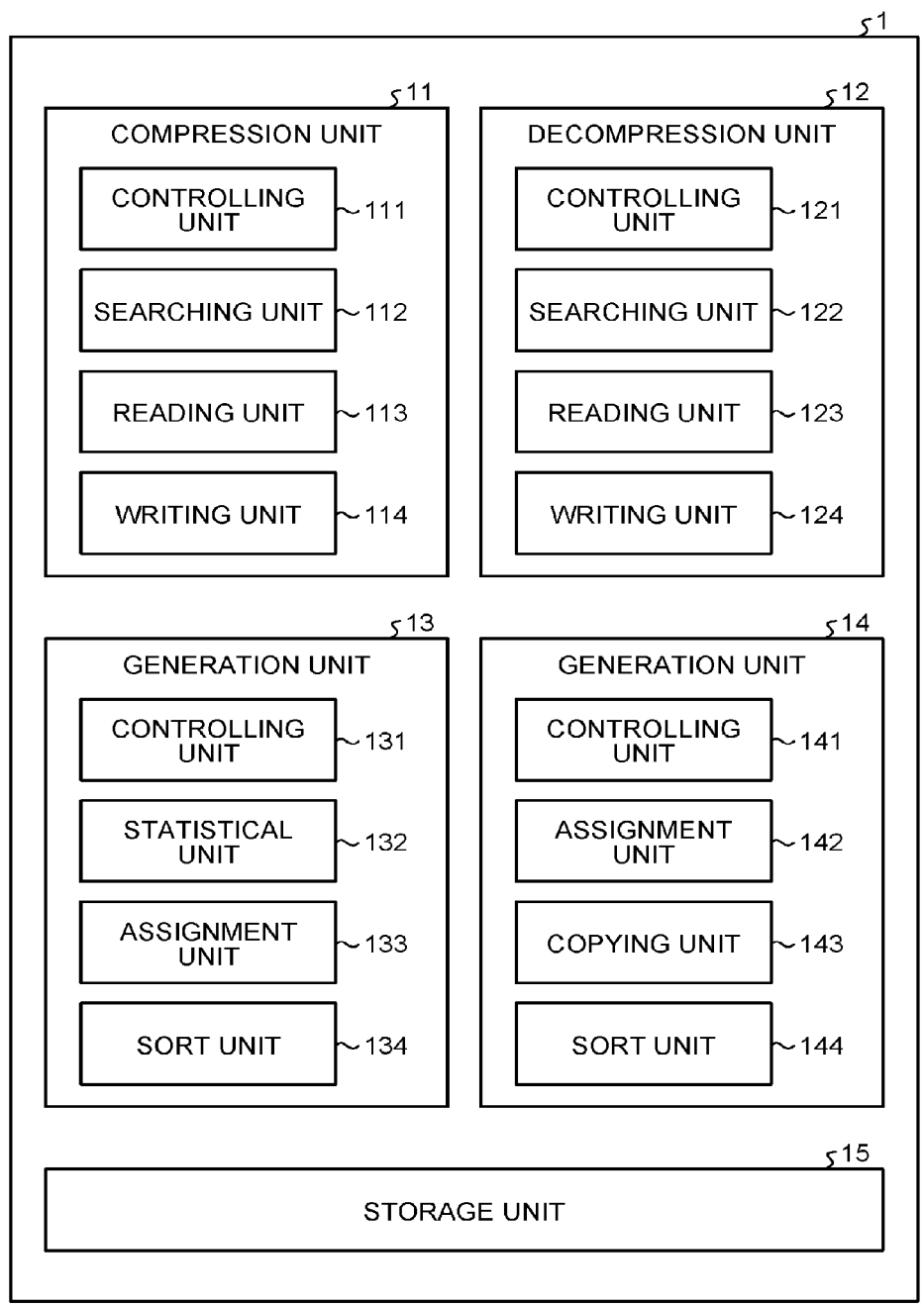
FIG. 4 is a configuration example of functional blocks.

The following describes an embodiment of the present invention.

[Example of Compressed Codes]

FIG. 1 is an example of a compression dictionary. A compression dictionary D0 includes a symbol compression dictionary D01 and a symbol string compression dictionary D02. The symbol compression dictionary D01 lists the correlation between character codes each representing a symbol, such as a character and a number, and compressed codes. The symbol string compression dictionary D02 lists the correlation between character code strings each representing a symbol string, such as a word and a tag, and compressed codes. A compression dictionary D1 includes a symbol compression dictionary D11, a symbol string compression dictionary D12, and a control symbol compression dictionary D13. The symbol compression dictionary D11 lists the correlation between character codes each representing a symbol, such as a character and a number, and compressed codes. The symbol string compression dictionary D12 lists the correlation between character code strings each representing a combination of a symbol string, such as a word and a tag, and a space symbol and compressed codes. The control symbol string compression dictionary D13 lists the correlation between character code strings each representing a combination of a control symbol for deleting the immediately preceding space symbol and a delimiter, and compressed codes.

Compression codes, and symbols or symbol strings that are correlated with the compressed codes are registered in a one-to-one relation on the compression dictionary D0 and the compression dictionary D1 exemplified in FIG. 1. Compression codes corresponding to symbols or symbol strings that match symbols or symbol strings read from compression target data are read, out of the symbols or symbol strings registered on the compression dictionary D0 and the compression dictionary D1.

In the present embodiment, the compressed codes included in the compression dictionary D0 are represented by "c'( )". When the compressed codes are represented as "c'( )", symbols or symbol strings corresponding to the respective compressed codes are indicated in parentheses. The compressed codes included in the compression dictionary D1 are represented by "c( )". For the compressed code "c( )", symbols or symbol strings corresponding to the respective compressed codes are indicated in parentheses. For example, the compressed code corresponding to "a" is represented as "compressed code c(a)" or the like, and the compressed code corresponding to "aboutΔ" is represented as "compressed code c(aboutΔ)" or the like. The space symbol is a symbol represented by 0x20 in the ASCII code system and is represented as "Δ" in the description of the present embodiment.

The control symbol for deleting a space symbol decompressed most recently, which will be described later in detail, is represented as "[−Δ]". For example, the compressed code c([−Δ];) corresponds to a combination of the control symbol [−Δ] and a delimiter ";".

The symbol string compression dictionary D02 in the compression dictionary D0 correlates one compressed code each with a symbol string and a space symbol independently, whereas the symbol string compression dictionary D12 in the compression dictionary D1 correlates a single compressed code not with a symbol string alone but with a combination of a symbol string and a space symbol. When compression is performed using the compression dictionary D1, combinations of symbol strings and space symbols that exist in compression target data are each encoded with the compressed code corresponding to the combination registered on the symbol string compression dictionary D12.

Meanwhile, combinations of symbol strings and delimiters (such as a comma and a colon) other than the space symbol are not registered on the symbol string compression dictionary D11. Not only symbol strings followed by the space symbol but also symbol strings followed by a delimiter other than the space symbol can occur in compression target data. Providing each symbol string compression dictionary D12 for each delimiter other than the space symbol, such as a comma and a colon, increases the number of types of compressed codes, which in turn increases the data size of the compression dictionary. Consequently, the control symbol indicating that the space symbol is to be deleted is used in common for all words. The control symbol compression dictionary D13 in the compression dictionary D1 correlates each combination of the control symbol and a delimiter with a single compressed code. For each combination of a symbol string and a delimiter other than the space symbol in compression target data, the corresponding compressed code in the symbol string compression dictionary D12 and the corresponding compressed code in the control symbol compression dictionary D13 are combined for encoding. The compressed codes registered on the control symbol compression dictionary D13 are used in common for all words registered on the symbol string compression dictionary D12, making it harder for the data size of the compression dictionary to increase as compared with the case where an individual symbol string compression dictionary D12 is provided for each delimiter.

FIG. 2 is an example of conversion to compressed codes. In FIG. 2, an exemplary English sentence E1 "HeΔspentΔmuchΔtimeΔforΔtalkingΔaboutΔhisΔinvention." is illustrated. In the example of FIG. 2, the exemplary English sentence E1 is stored in a storage area A1. Compression code examples (1) to (4) are illustrated for both parts "aboutΔ" and "invention." in the exemplary English sentence E1. The compressed code examples (1) and (3) are examples in which the compressed codes included in the compression dictionary D0 are used, and the compressed code examples (2) and (4) are examples in which the compressed codes included in the compression dictionary D1 are used.

Example (1) in FIG. 2 illustrates the example where the part "aboutΔ" in the exemplary English sentence E1 is compressed based on the compression dictionary D0. The compressed code c'(about) and the compressed code c'(Δ) corresponding to the word "about" and the symbol "Δ", respectively, included in "aboutΔ" are used for compressed data. In other words, compressed data corresponding to the part "aboutΔ" in the exemplary English sentence E1 is "c'(about)c'(Δ)" in Example (1).

Example (2) in FIG. 2 illustrates the example where the part "aboutΔ" in the exemplary English sentence E1 is compressed based on the compression dictionary D1. Because the word "aboutΔ" is registered on the symbol string compression dictionary D12, compressed data corresponding to the part "aboutΔ" in the exemplary English sentence E1 is "c(aboutΔ)". In Example (1), the compressed data for the part "aboutΔ" is made up of two compressed codes, whereas in Example (2), the compressed data for the part "aboutΔ" is made up of one compressed code.

Example (3) in FIG. 2 illustrates the example where the part "invention." in the exemplary English sentence E1 is compressed based on the compression dictionary D0. The compressed code c'(invention) and the compressed code c'(.) corresponding to the word "invention" and the symbol ".", respectively, included in "invention." are used for compressed data. In other words, compressed data corresponding to the part "invention." in the exemplary English sentence E1 is "c'(invention)c'(.)" in Example (3).

Example (4) in FIG. 2 illustrates the example where the part "invention." in the exemplary English sentence E1 is compressed based on the compression dictionary D1. The word "inventionΔ" is registered on the symbol string compression dictionary D12. When the last space symbol "Δ" in the symbol strings registered on the symbol string compression dictionary D12 is a delimiter other than the space symbol, such as ".", ",", ";", and ":", the compressed code ("inventionΔ") including the space symbol "Δ" is used for compressed data. In other words, even when the part to be compressed is "invention.", the compressed code c(invention∆) is used. In this case, the compressed code c([-∆].) registered on the control symbol compression dictionary D13 is further used. The compressed code c([-∆].) is a compressed code corresponding to a combination of the control symbol [-∆] and the symbol ".". The control symbol [-∆] is a control symbol indicating that the immediately preceding space is to be negated. A blank code in the character code system used in compression target data is assigned to the code for the control symbol.

Compressed data corresponding to the part "invention." in the exemplary English sentence E1 is "c(invention∆)c ([-∆].)" in Example (4). In Examples (3) and (4), the compressed data corresponding to "invention." is made up of two compressed codes.

When the space symbol is used in data to be compressed, compressed data includes less compressed codes in the case where the compression dictionary D1 is used than the case where the compression dictionary D0 is used. In contrast to this, when delimiters other than the space symbol exist, compressed data includes the same number of compressed codes regardless of whether the compression dictionary D0 or the compression dictionary D1 is used. Consequently, when a combination of a symbol string and the space symbol registered on the symbol string compression dictionary D12 occurs in compression target data, using the compression dictionary D1 reduces the number of compressed codes to be used for compressed data as compared with the case of using the compression dictionary D0.

Furthermore, substantially the same number of space symbols is included as that of words in compression target data. This is because boundaries between words are represented by space symbols in document data described in languages such as English. In contrast to this, delimiters other than the space symbol are used about once or twice in a sentence. The space symbol is used more frequently than delimiters other than the space symbol in document data.

Meanwhile, as compressed codes are registered on the control symbol compression dictionary D13, the compression dictionary D1 includes correspondingly more compressed codes than the compression dictionary D0. The number of compressed codes in the control symbol compression dictionary D13 is, however, less by far than the number of types of characters. For example, even if compressed codes relating to an exclamation mark, a comma, a period, a colon, a semicolon, and a question mark are registered on the control symbol compression dictionary D13, the number of types of compressed codes to be used increases only by six.

Even if the number of types of compressed codes increases by six, the compressed code length hardly changes as the compression dictionary as a whole. Even if the number of types of compressed codes included in the compression dictionary is doubled, the compressed code length increases only by one bit for each compressed code.

Thus, registering the space symbol that exists as frequently as the number of words in combination with the words has more effect than increasing the compressed code length by adding the control symbol compression dictionary D13. It is therefore expected that the compression ratio will be improved by using the compression dictionary D1 to perform compression.

[Example of Decompression Procedure]

FIG. 3 is an example of conversion to decompressed data. FIG. 3 exemplifies steps (1) to (5) of generating decompressed data corresponding to the compressed code "c(invention)c([-∆].)", which is an example of the compressed data generated by using the compression dictionary D1 in FIG. 2. A storage area A3 is a storage area in which compressed data is stored. A storage area A5 is a buffer area in which a decompression code corresponding to the compressed code stored in the storage area A3 is stored. A storage area A4 is a storage area in which decompressed data to be generated based on the decompression code stored in the storage area A5 is stored.

Step (1) of FIG. 3 illustrates the state where the compressed data is stored in the storage area A3. A decompression code corresponding to the compressed code c(invention∆) is first generated. Step (2) of FIG. 3 is the state where the decompression code generated at Step (1) is written into the storage area A4. Subsequently, decompression codes corresponding to the compressed code c([-∆].) are generated. Step (3) of FIG. 3 illustrates the state where the decompression codes "[-∆]" and "." generated at Step (2) are written. Control is performed on the storage area A4 based on the control symbol [-∆] stored in the storage area A5. Step (4) of FIG. 3 illustrates the state where control has been performed based on the control symbol [-∆]. The space symbol A, which existed following "invention" in the state of Step (3), has been deleted in the state of Step (4). Furthermore, writing is performed into the storage area A4 based on "." stored in the storage area A5. Step (5) of FIG. 3 illustrates the state where "." is written following "invention".

In Step (3) of FIG. 3, the writing position into the storage area A4 may be shifted instead of deleting the space symbol ∆ in the storage area A4. In this case, a symbol ("." in this case) following the control symbol is written over the space symbol.

Conversion processing is performed according to the control symbol [-∆] in the above-described steps. A mismatch resulting from generating compressed data by using a compressed code corresponding to the symbol string registered on the compression dictionary D1 even for symbol strings the last space symbol of which does not match can be resolved by using the control symbol [-∆].

The above-described compression processing reduces the number of compressed codes used for compressed data while limiting the increase in types of compressed codes to a small number, thus improving the compression ratio. Additionally, when compressed data that has been compressed through the above-described compression processing is to be decompressed, the number of target compressed codes is small, so that the decompression speed is expected to be improved.

To prevent a compressed code corresponding to the space symbol from appearing frequently in compressed data, the space symbol can be considered to be automatically generated whenever a word is generated in decompression processing, instead of generating the compressed code corresponding to the space symbol in decompression processing in the first place, for example.

Words that are not registered on the compression dictionary are, however, subject to generation processing of compressed codes for each character. Because compressed data includes a compressed code representing a word and a compressed code representing a symbol such as a character, and decompression codes corresponding to the respective compressed codes are each determined to be a word or a symbol whenever the decompression code is generated. A mechanism is also needed to identify whether each compressed code corresponds to a word or a character.

Furthermore, because a delimiter other than the space symbol can occur following a word, after a decompression code is determined to be a word, a decompression code subsequent to the word is determined whether to be a delimiter other than the space symbol. Once the determination is made, whether to place the space symbol across a plurality of decompression codes is determined, complicating the determination algorithm. As a result, the decompression speed is deteriorated, as well as a major change is needed for the source code of a decompression program that already exists.

In decompression processing according to the present embodiment, only whether each decompression code is the control symbol is determined. For example, this can be achieved by performing determination processing on the control symbol written into a register and the register into which a decompression code read from a decompression dictionary is written. Performing multiple determination processing on a single decompression code or creating a decompression program with a complicated algorithm is avoided. Performing processing across a plurality of decompression codes is also prevented, reducing the number of registers to be used.

[Description of Functions and Procedures]

FIG. 4 is a configuration example of functional blocks. A computer 1 includes a compression unit 11, a decompression unit 12, a generation unit 13, a generation unit 14, and a storage unit 15. The storage unit 15, for example, stores therein a file F1 to be compressed, a compressed file F2, a decompressed file F3, the compression dictionary D2, and a decompression dictionary D3. The storage unit 15, for example, also stores therein a word list L1 used to generate the compression dictionary D2 and the decompression dictionary D3. The word list L1 is a list of word groups to which compressed codes are assigned. The storage unit 15 provides storage areas such as the storage areas A1, A2, A3, A4, and A5, which are used as work areas by the compression unit 11, the decompression unit 12, the generation unit 13, and the generation unit 14. The compression unit 11 executes compression processing of the file F1 stored in the storage unit 15, and generates the compressed file F2. The decompression unit 12 executes decompression processing of the compressed file F2 stored in the storage unit 15, and generates the decompressed file F3. The generation unit 13 generates the compression dictionary D2 used by the compression unit 11 for compression processing. The generation unit 14 generates the decompression dictionary D3 used by the decompression unit 12 for decompression processing.

The compression unit 11 includes a controlling unit 111, a searching unit 112, a reading unit 113, and a writing unit 114. The controlling unit 111 controls the searching unit 112, the reading unit 113, and the writing unit 114, and executes compression processing of the file F1. The controlling unit 111 loads the file F1 in the storage area A1. The reading unit 113 reads data from the file F1. The searching unit 112 searches the compression dictionary D2 for the data read by the reading unit 113. The writing unit 114 writes the compressed codes according to the searching results of the searching unit 112 in the storage area A2. The controlling unit 111 manages the reading position of the reading unit 113 and the writing position of the writing unit 114. For example, the controlling unit 111 causes the reading unit 113 and the writing unit 114 to sequentially process the symbols or the symbol strings included in the file F1. The controlling unit 111 also generates the compressed file F2 based on the compressed data stored in the storage area A2, and stores the compressed file F2 in the storage unit 15.

The decompression unit 12 includes a controlling unit 121, a searching unit 122, a reading unit 123, and a writing unit 124. The controlling unit 121 controls the searching unit 122, the reading unit 123, and the writing unit 124, and executes decompression processing of the compressed file F2. The controlling unit 121 loads the compressed file F2 in the storage area A3. The reading unit 123 reads the compressed codes from the compressed file F2. The searching unit 122 searches the decompression dictionary D3 for the compressed codes read by the reading unit 123. The writing unit 124 writes the decompression codes according to the searching results of the searching unit 122 in the storage area A4. When the decompression codes obtained from the searching results of the searching unit 122 indicate the control symbol, the controlling unit 121 adjusts the writing position at which the writing unit 124 performs writing to move it back by one space symbol (one byte, for example). The controlling unit 121 manages the reading position of the reading unit 123 and the writing position of the writing unit 124. For example, the controlling unit 111 causes the reading unit 123 and the writing unit 124 to sequentially process the compressed codes included in the compressed file F2. The controlling unit 121 also generates the decompressed file F3 based on the decompressed data stored in the storage area A4, and stores the decompressed file F3 in the storage unit 15.

The generation unit 13 includes a controlling unit 131, a statistical unit 132, an assignment unit 133, and a sort unit 134. The generation unit 13 generates the compression dictionary D2 according to an instruction from the compression unit 11. The controlling unit 131 controls the statistical unit 132, the assignment unit 133, and the sort unit 134, and generates the compression dictionary D2 used to compress the file F1. The statistical unit 132 counts the number of appearance of characters and words included in the file F1, for example, to generate statistical information on each character and word. The sort unit 134 sorts the characters and words on which the statistical information has been generated, based on the statistical information generated by the statistical unit 132. The assignment unit 133 generates a compressed code corresponding to each character and word based on the statistical information generated by the statistical unit 132, and assigns the generated compressed code to the corresponding character or word. The sort unit 134 also sorts the characters and words to which the respective compressed codes have been assigned, in a sequence of character codes corresponding to the characters and words (for example, in ascending order of the character code values). The controlling unit 131 generates the compression dictionary D2 based on the processing results of the statistical unit 132, the assignment unit 133, and the sort unit 134, and stores the compression dictionary D2 in the storage unit 15. The controlling unit 131 also stores the statistical information generated by the statistical unit 132 in the storage unit 15.

The generation unit 14 includes a controlling unit 141, an assignment unit 142, a copying unit 143, and a sort unit 144. The generation unit 14 generates the decompression dictionary D3 according to an instruction from the decompression unit 12. The controlling unit 141 controls the assignment unit 142, the copying unit 143, and the sort unit 144, and generates the decompression dictionary D3 used to decompress the compressed file F2. The assignment unit 142 generates a compressed code corresponding to each character and word by using the statistical information stored in the storage unit 15. The sort unit 144 sorts character information to which the compressed code has been assigned, according to the value of the compressed code. The copying unit 143 copies the character code indicating a character or a word corresponding to the compressed code, according to the code length of each compressed code that has been sorted. The controlling unit 141 generates the decompression dictionary D3 by arranging the character code copied by the copying unit 143 at the offset position corresponding to the compressed code generated by the assignment unit 142. The controlling unit 141 also stores the decompression dictionary D3 in the storage unit 15.

Figure 12:
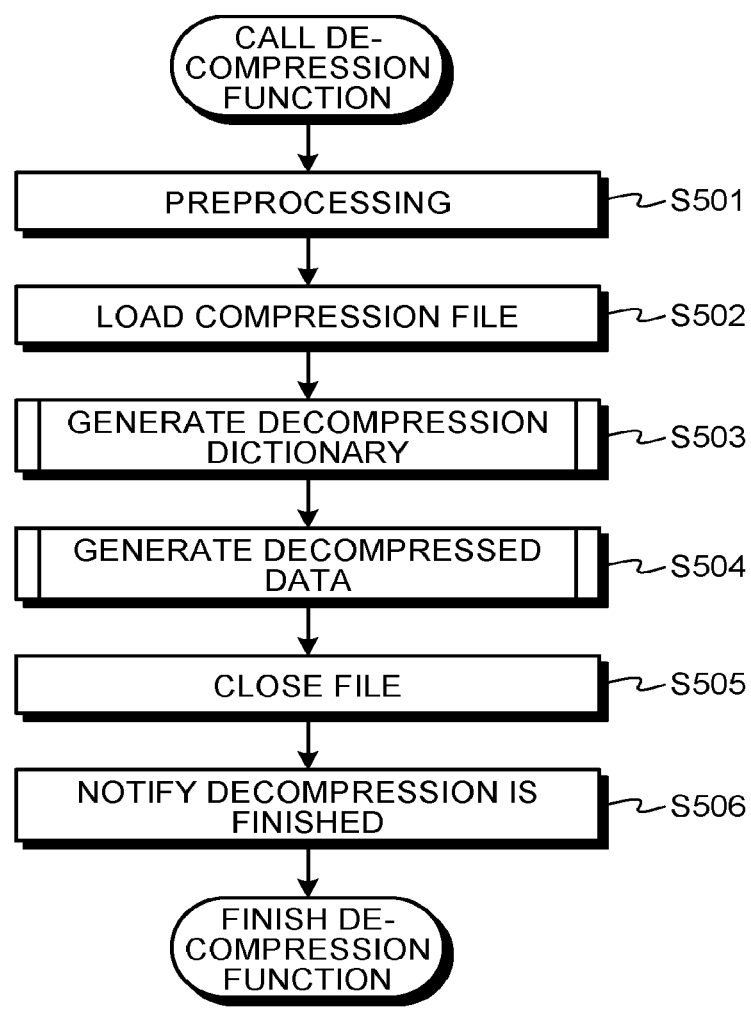
FIG. 12 is an example of a procedure for performing a decompression function.
Figure 13:
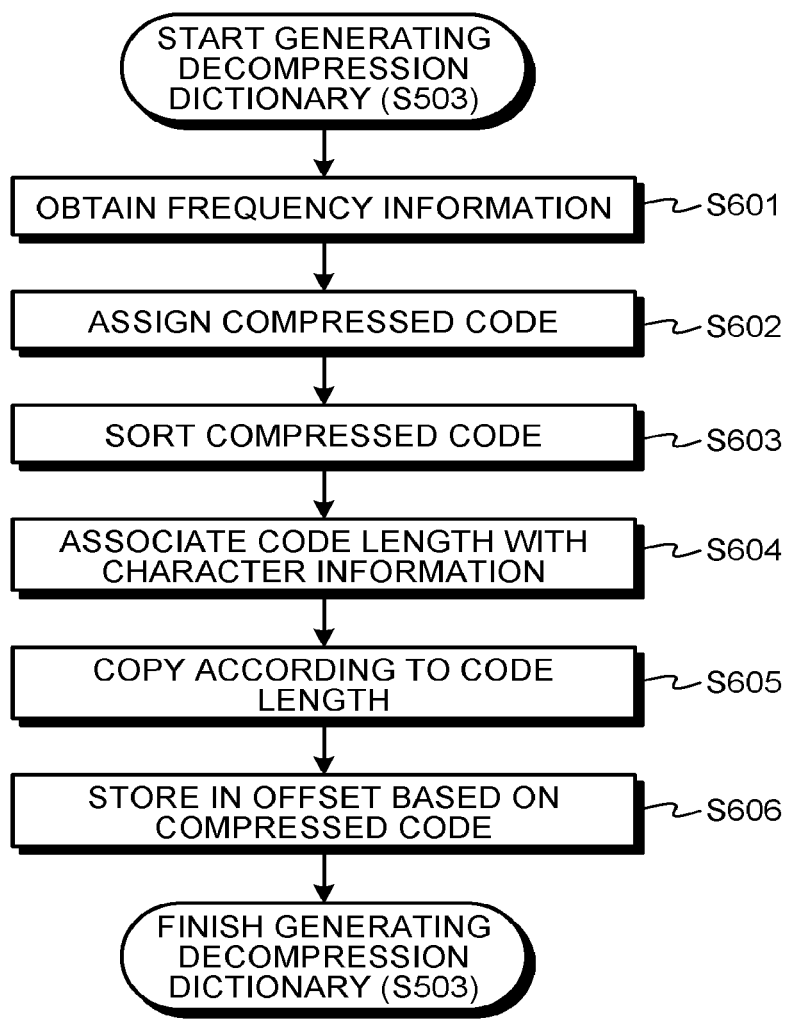
FIG. 13 is an example of a procedure for generating a decompression dictionary.
Figure 14:
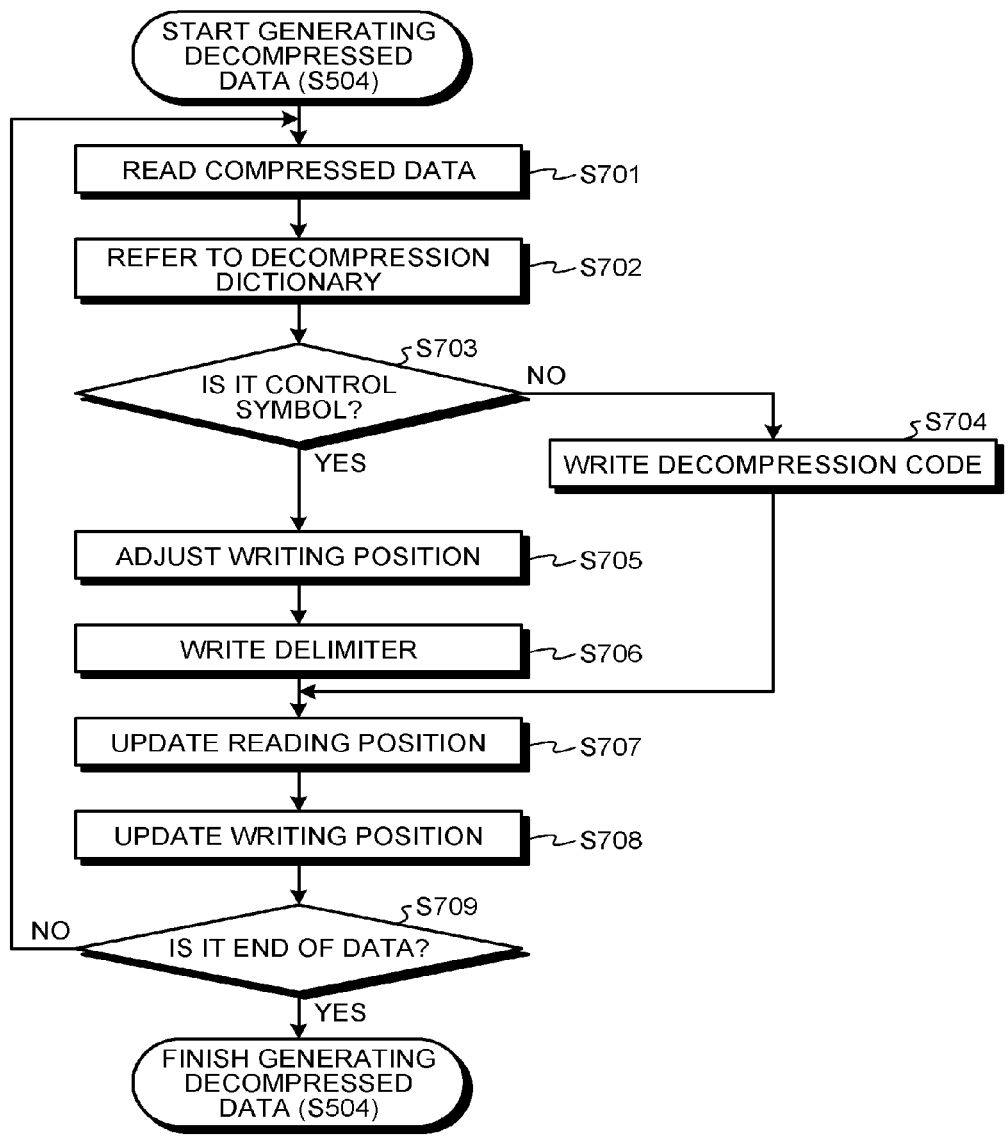
FIG. 14 is an example of a procedure for generating decompressed data.

The compression unit 11 and the generation unit 13 compress the file F1. The compression procedures are illustrated in FIG. 5, FIG. 6, FIG. 7, FIG. 9, and FIG. 10. The compression unit 12 and the generation unit 14 decompress the compressed file F2. The decompression procedures are illustrated in FIG. 12, FIG. 13, and FIG. 14.

Figure 5:
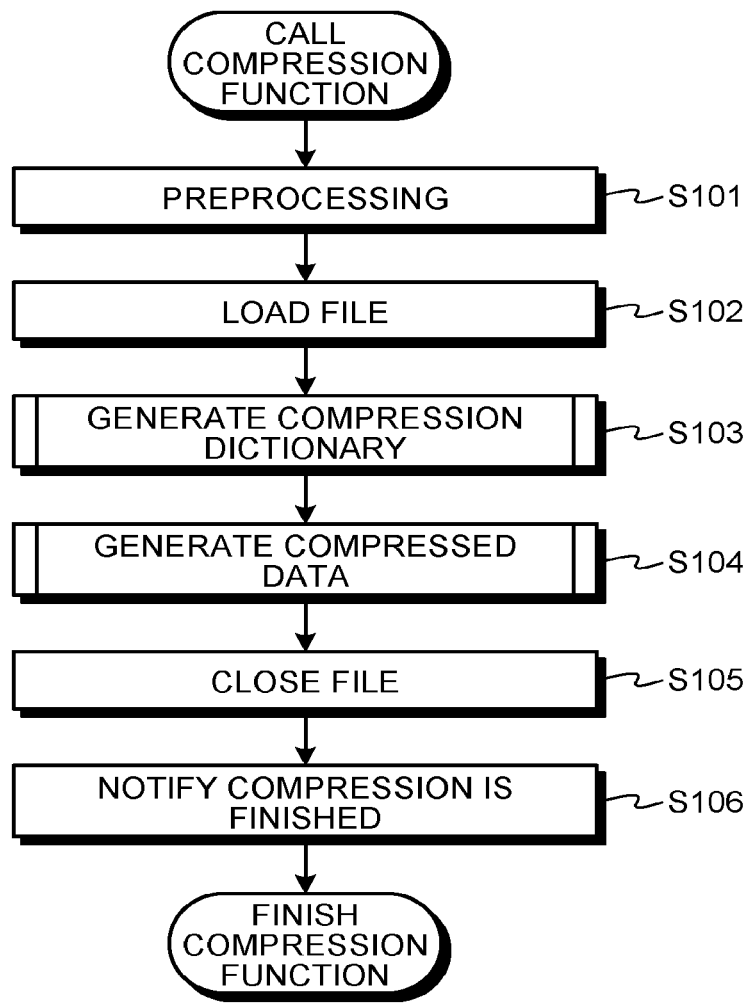
FIG. 5 is an example of a procedure for performing a compression function.

FIG. 5 is an example of a procedure for performing a compression function. When the compression function is called, the controlling unit 111 executes preprocessing of the compression processing (S101). The calling of the compression function includes a specification of the file F1 to be compressed. In the preprocessing at S101, the controlling unit 111 secures the storage area A1 and the storage area A2, loads the word list L1 from the storage unit 15, and secures the storage area for a statistical table T1 and the compression dictionary D2.

When the processing at S101 is finished, the controlling unit 111 loads the file F1 in the storage area A1 (S102). If the size of the file F1 is larger than a predetermined size, the controlling unit 111 divides the file F1 into blocks, and performs the following compression processing on each block obtained by the division. The controlling unit 111 then instructs the generation unit 13 to generate the compression dictionary D2 (S103).

Figure 6:
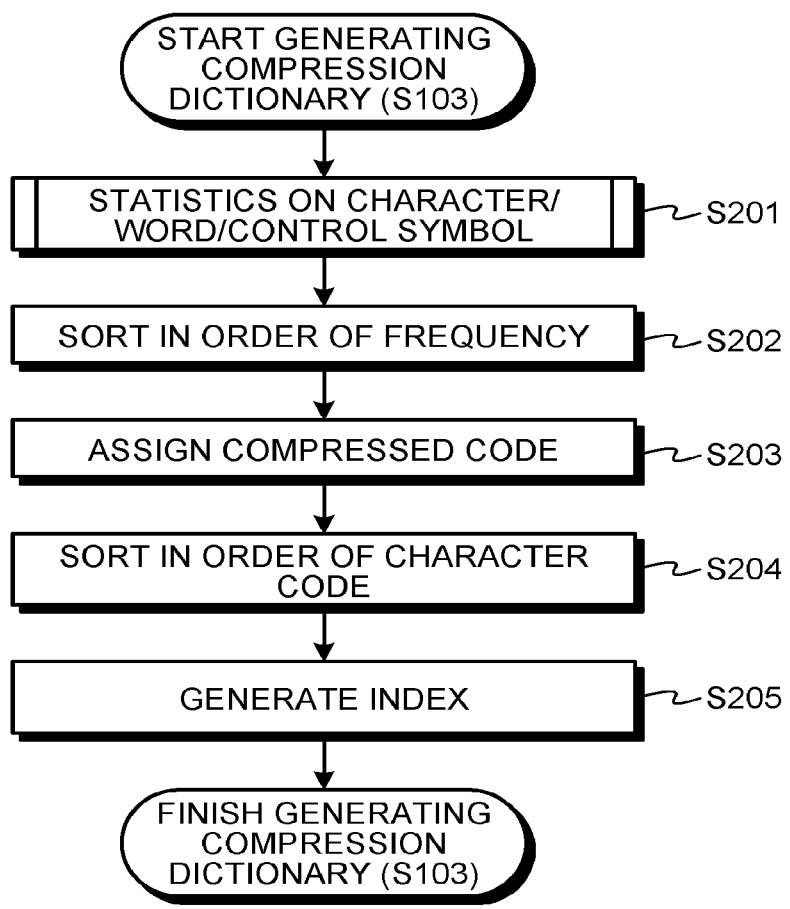
FIG. 6 is an example of a procedure for generating a compression dictionary.

FIG. 6 is an example of a procedure for generating a compression dictionary. On receiving an instruction to generate the compression dictionary from the controlling unit 111, the controlling unit 131 causes the statistical unit 132 to perform statistical processing of the file F1 (S201).

Figure 7:
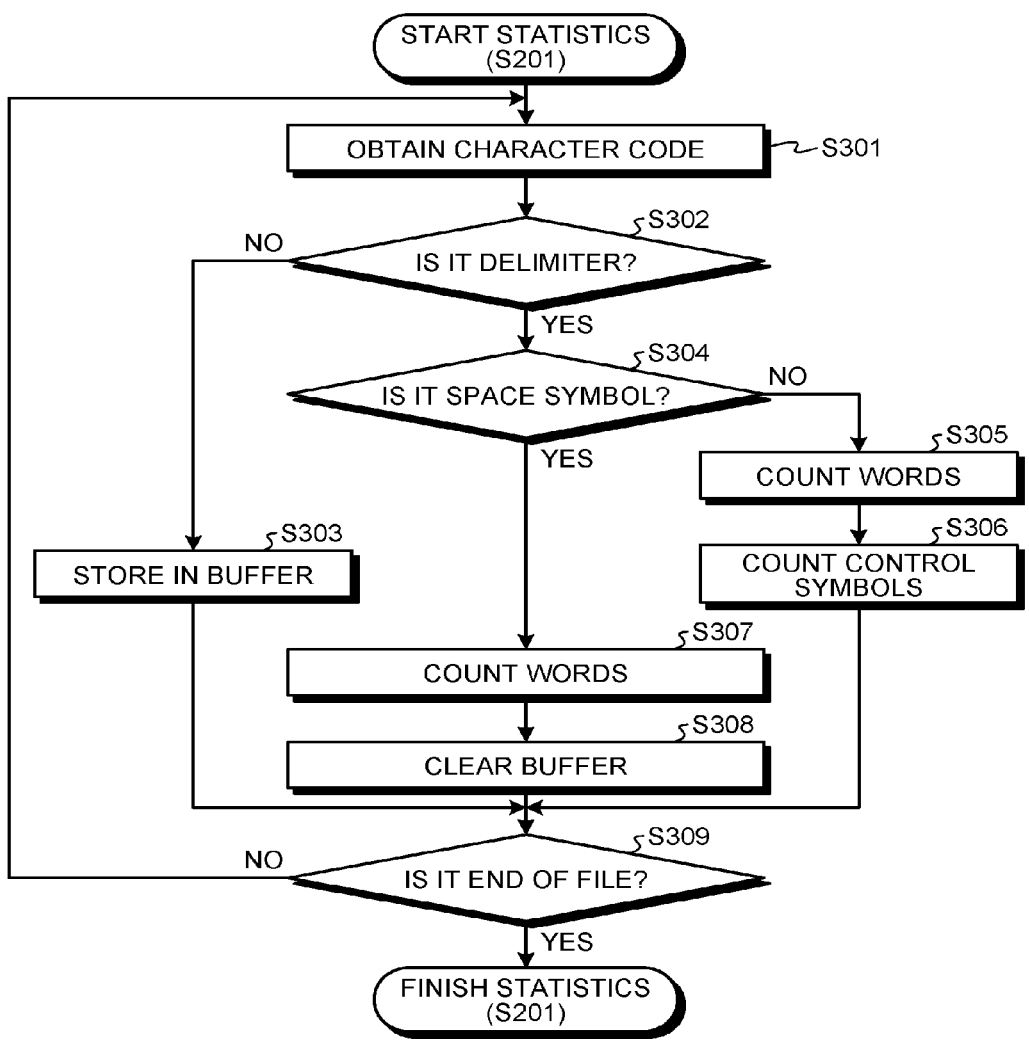
FIG. 7 is an example of a procedure for performing statistical processing.

FIG. 7 is an example of a procedure for performing statistical processing. On receiving an instruction to performing statistical processing from the controlling unit 131, the statistical unit 132 starts statistical processing for the file F1 loaded in the storage area A1. The statistical processing is started from the reading position, which is the beginning of the file F1 loaded in the storage area A1. The statistical unit 132 obtains a character code from the reading position of the storage area A1 (S301). In the processing at S301, the reading position is advanced as many as the character code obtained at S301.

The statistical unit 132 then determines whether the character code obtained at S301 is a delimiter (S302). S302 is determined by setting the character codes that serve as delimiters in advance and judging whether the character code obtained at S301 corresponds to any of the character codes set in advance. The delimiter, for example, is a space symbol (0x20 in the ASCII code system), an exclamation mark (0x21 in the ASCII code system), a comma (0x2C in the ASCII code system), a period (0x2E in the ASCII code system), a colon (0x3A in the ASCII code system), a semicolon (0x3B in the ASCII code system), and a question mark (0x3F in the ASCII code system). S302 may also be determined based on whether the character code obtained at S301 is within a predetermined value range (such as between 0x20 and 0x3F).

If the character code obtained at S301 is not the delimiter (No at S302), the statistical unit 132 stores the character code obtained at S301 in a buffer (S303). When the processing at S303 is finished, the process proceeds to step S309.

If the character code obtained at S301 is the delimiter (Yes at S302), the statistical unit 132 determines whether the character code obtained at S301 is the space symbol (S304). As an example, the determination at S304 may be made prior to the determination at S302. In this case, if the condition at S304 is not satisfied, the statistical unit 132 makes the determination at S302. If the determination condition at S302 is satisfied, the process proceeds to step S305. If the determination condition at S302 is not satisfied, the process proceeds to step S303.

If the character code obtained at S301 is not the space symbol (No at S304), the statistical unit 132 performs count processing of words (S305). In other words, the statistical unit 132 increments the number of appearance stored in the statistical table T1 for the character string created by joining the character code (or character code string) stored in the buffer and the latest character code obtained at S301. In the processing at S305, if the statistical table T1 includes no corresponding character string, the statistical unit 132 increments the number of appearance in the statistical table T1 for both of the character code in the buffer and the latest character code obtained at S301.

FIG. 8 is an example of the statistical table T1. The statistical table T1 stores therein the individual number of appearance for each symbol such as a character and a number, each word included in the word list L1, and combinations of the control symbol and each delimiter.

As another example of statistical processing that uses the statistical table T1, the statistical unit 132 may register the character string delimited by satisfying the determination condition at S302, as a word on the statistical table T1. As still another example, if the statistical table T1 includes no corresponding character string, the statistical unit 132 registers the character string as a new word on the statistical table T1. This processing prevents compressed codes from being assigned to words that are included in the word list L1 but not included in the file F1. Compression codes are also assigned to words that are not included in the word list L1 but included in the file F1. The words that are included in the word list L1 but not included in the file F1 are also registered on the statistical table T1, preventing the storage area from being taken up.

When the processing at S305 is finished, the statistical unit 132 counts combinations of the control symbol and a delimiter (S306). At S306, the number of appearance is incremented for the combination of the control symbol for deleting the space symbol and the delimiter obtained at S301. When the processing at S306 is finished, the statistical unit 132 proceeds to step S309.

If the character code obtained at S301 is the space symbol (Yes at S304), the statistical unit 132 counts words similarly to S305 (S307). Similarly to S305, if the statistical table T1 includes no corresponding word, the statistical unit 132 also counts each character code including the character codes stored in the buffer. When the processing at S307 is finished, the statistical unit 132 clears the buffer (S308).

When any one of S303, S306, and S308 is performed, the statistical unit 132 determines whether the reading position is the end of the file F1 loaded in the storage area A1 (S309). If it is determined that it is not the end at S309 (No at S309), the statistical unit 132 proceeds to step S301. If it is determined that it is the end at S309 (Yes at S309), the statistical unit 132 finishes the statistical processing.

When the statistical processing by the statistical unit 132 is finished, the controlling unit 131 returns to the procedure in FIG. 6, and causes the sort unit 134 to execute sorting processing (S202). The sort unit 134 rearranges the character information registered on the statistical table T1 (symbols such as characters, symbol strings such as words, combinations of the control symbol and a delimiter, for example), based on the statistical information (number of appearance of each piece of character information) generated by the statistical unit 132. For example, the statistical unit 132 rearranges the pieces of character information registered on the statistical table T1, in either ascending order or descending order of the number of appearance.

When the processing at S202 is finished, the controlling unit 131 causes the assignment unit 133 to assign compressed codes (S203). The assignment unit 133 assigns compressed codes to the character information group rearranged in the order of the number of appearance at S202, based on the algorithm of Huffman coding or arithmetic coding, in which a shorter compressed code is assigned to the character information that appears more frequently. When a compressed code is assigned to each piece of character information, the controlling unit 131 causes the sort unit 134 to sort a pair of each piece of the character information and the compressed code assigned to the piece of the character information, based on the piece of the character information (S204). The sort unit 134, for example, rearranges the character codes of the pieces of character information in ascending order. The sort unit 134, for example, arranges the pieces of character information in ascending order according to the character code value of the first letter. If the first letters of the pieces of character information have the same character code, the sort unit 134 arranges the pieces of character information in ascending order according to the character code value of the second letter. The state where the rearrangement is made in the processing at S204 is the compression dictionary D2 illustrated in FIG. 11.

When the processing at S204 is finished, the controlling unit 131 generates an index (S205). The controlling unit 131 generates the index by correlating the character information with information indicating the position (offset) of the character information in the character information group sorted at S204. For example, an offset "0x126" or the like is correlated with a character "i" in the compression dictionary D2 illustrated in FIG. 11. When the index is utilized in the generation of compressed codes, a search for the compressed code corresponding to the word beginning with "i" starts from "0x126". When the processing at S205 is finished, the generation unit 13 finishes the generation processing of the compression dictionary D2.

FIG. 11 is an example of a data structure of a compression dictionary. The character information and the compressed code are correlated with one another and stored in the compression dictionary D2 illustrated in FIG. 11. The storage position of a pair of the character information and the compressed code is indicated by the offset that sets the storage position in the compression dictionary D2 to the starting point. For example, information on the character information "inventΔ" is stored in the offset 0x0140. The index generated at S205 narrows down the searching range by using this offset. As described above, "c( )" indicates that it is a compressed code corresponding to the character information within the parentheses.

The compression dictionary D2 is generated by the generation unit 13. However, as another example, the compression dictionary D2 may be stored in the storage unit 15 in advance. In this case, the compression dictionary D2 is used in common for a plurality of files. For example, in the compression dictionary D2 stored in the storage unit 15 in advance, compressed codes are assigned based on the statistical information on the character information in the file compressed in the past or in a plurality of files that exist in a database.

When the generation unit 13 finishes the generation processing of the compression dictionary D2, the controlling unit 111 returns to the procedure in FIG. 5, and executes the generation processing of compressed data (S104).

Figure 9:
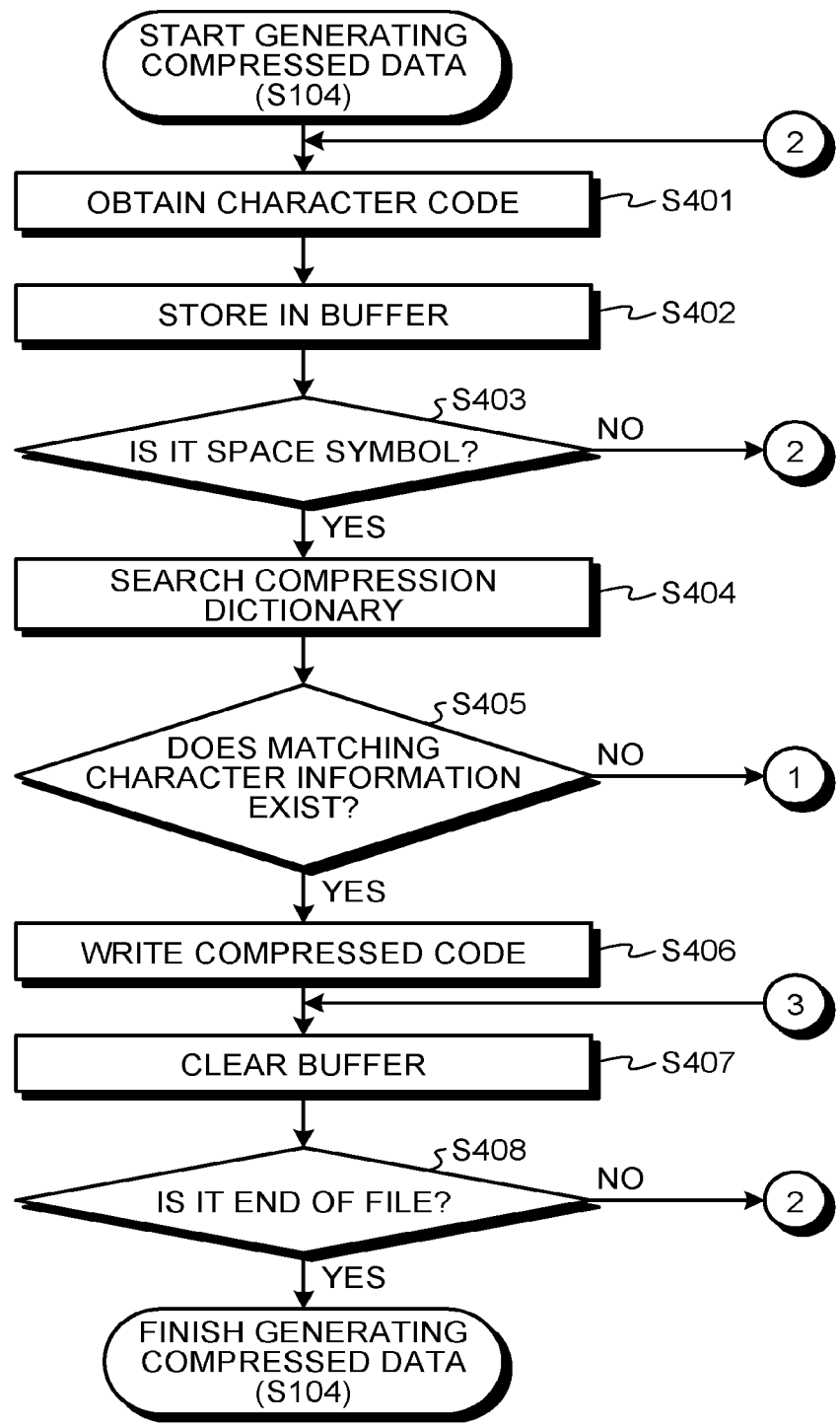
FIG. 9 is an example of a procedure for generating compressed data.

FIG. 9 is an example of a procedure for generating compressed data. At the beginning of generating processing of compressed data, the reading position is set at the starting point of the file F1 loaded in the storage area A1, the writing position is set at a predetermined position in the storage area A2, and the buffer is to be cleared. The reading unit 113 obtains a character code from the reading position (S401). After the character code is obtained at S401, the controlling unit 111 updates the reading position. The controlling unit 111 also stores the character code obtained by the reading unit 113 at S401 in the buffer (S402). The controlling unit 111 determines whether the character code obtained at S401 is the space symbol (S403).

If the character code obtained at S401 is not the space symbol (No at S403), the procedure returns to step S401, and the reading unit 113 obtains a character code from the reading position. In other words, steps S401 and S402 are repeated until the space symbol is read.

If the character code obtained at S401 is the space symbol (Yes at S403), the searching unit 112 searches the compression dictionary D2 for the character code (or character code string) stored in the buffer (S404). The controlling unit 111 determines whether matching character information that matches the character code (or character code string) stored in the buffer exists in the compression dictionary D2 (S405). The processing for the case where the matching character information does not exist in compression dictionary D2 (No at S405) will be described later based on FIG. 10. If the matching character information exists (Yes at S405), the writing unit 114 writes, at the writing position in the storage area A2, the compressed code correlated with the matching character information in the compression dictionary D2 (S406). Subsequently, the controlling unit 111 updates the writing position, and deletes (clears) the character code (or character code string) stored in the buffer (S407). The controlling unit 111 then determines whether the reading position is the end of the file F1 loaded in the storage area A1 (S408).

If the reading position is not the end of the file F1 (No at S408), the procedure returns to step S401, and the reading unit 113 obtains a character code from the reading position. If the reading position is the end of the file F1 (Yes at S408), the controlling unit 111 finishes the generation processing of compressed data.

Figure 10:
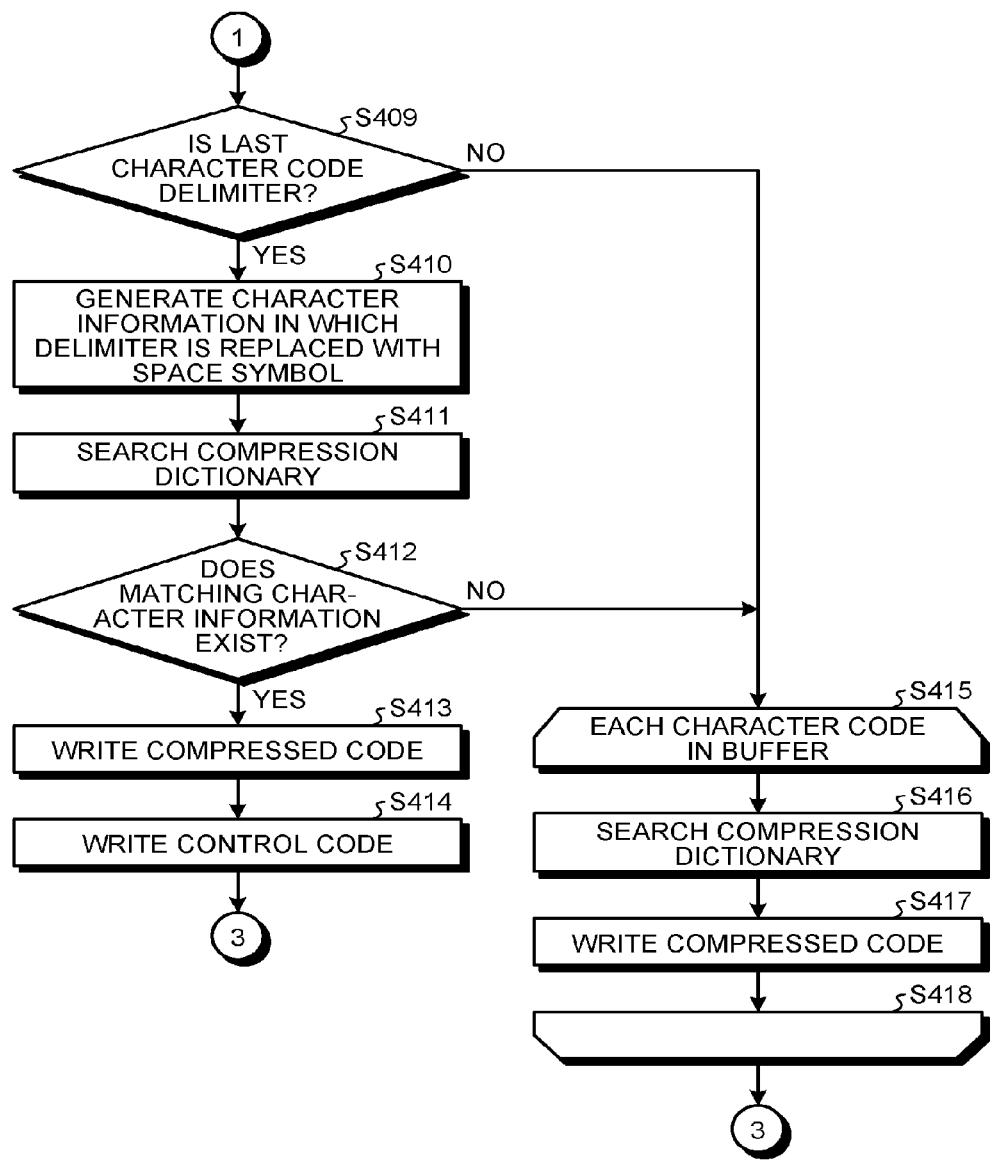
FIG. 10 is an example of a procedure for generating compressed data.

FIG. 10 is an example of a procedure for generating compressed data. In the processing at S405, if the matching character information does not exist in compression dictionary D2 (No at S405), the controlling unit 111 determines whether the last character code in the character code (or character code string) delimited with the space symbol is a delimiter (S409). In other words, whether the character code immediately preceding the space symbol represents a delimiter is determined in the character code string stored in the buffer. A determination condition similar to that at S302 in FIG. 7 is used to determine whether it is a delimiter.

If it is determined that the last character code is a delimiter at S409 (Yes at S409), the controlling unit 111 generates a character code string in which the last delimiter is replaced with the space symbol, out of the character code string up to the last delimiter in the buffer (S410). The searching unit 112 searches the compression dictionary D2 for the character code string generated at S410 (S411). The controlling unit 111 determines whether matching character information that matches the character code string generated at S410 exists in the compression dictionary D2, based on the searching results at S411 (S412).

If the matching character information exists (Yes at S412), the writing unit 114 writes, at the writing position in the storage area A2, the compressed code correlated with the matching character information in the compression dictionary D2 (S413). The controlling unit 111 updates the writing position according to the writing by the writing unit 114. The writing unit 114 then writes, at the writing position in the storage area A2, the compressed code (control code) correlated with the combination of the control symbol and the delimiter and the compressed code correlated with the space symbol in the compression dictionary D2 (S414). The controlling unit 111 updates the writing position according to the writing by the writing unit 114.

If the matching character information does not exist (No at S412) or if the last character code is not a delimiter (No at S409), the controlling unit 111 performs processing on each character code in the buffer (S415 to S418). The controlling unit 111 causes the searching unit 112 to search the compression dictionary D2 for each character code (S416), and causes the writing unit 114 to write the compressed code obtained as a result of the search at the writing position (S417). When the processing at S416 and S417 is performed on each character code stored in the buffer, the procedure returns to S407, and the controlling unit 111 clears the character code string stored in the buffer.

When the above-described generation processing of compressed data is finished, the procedure returns to S105 illustrated in FIG. 5. The controlling unit 111 generates the compressed file F2 by using the compressed data stored in the storage area A2, and stores it in the storage unit (S105). The compressed file F2, for example, is made up of a header, compressed data in the storage area A2, and trailer information. The header, for example, includes identifying information to identify the compression algorithm, and information such as individual data sizes of the header, the compressed data, and the trailer information. The trailer information, for example, includes the statistical table T1 or the decompression dictionary D3 corresponding to the compression dictionary D2. The decompression dictionary D3 will be described later based on FIG. 15.

When the processing at S105 is finished, the controlling unit 111 notifies the calling destination of the compression function that the compression processing is finished (S106). The notification at S106, for example, includes information indicating the storage destination of the compressed file F2. When the processing at S106 is finished, the compression unit 11 finishes the compression processing.

FIG. 12 is an example of a procedure for performing a decompression function. When the decompression function is called, the controlling unit 121 executes preprocessing of the decompression processing (S501). The calling of the decompression function includes a specification of the compressed file F2 to be decompressed. In the preprocessing at S501, the controlling unit 121 secures the storage area A3 and the storage area A4, loads the statistical table T1 from the compressed file F2, and further secures a storage area for the decompression dictionary D3.

When the processing at S501 is finished, the controlling unit 121 loads the compressed file F2 in the storage area A3 (S502). The controlling unit 121 then causes the generation unit 14 to generate a decompression dictionary (S503).

FIG. 13 is an example of a procedure for generating a decompression dictionary. The controlling unit 141 obtains the statistical table T1 from the trailer information in the compressed file F2 loaded in the storage area A3 (S601). Once the statistical table T1 is obtained, the assignment unit 142 assigns a compressed code to each piece of the character information in the statistical table T1 (S602). In the processing at S602, a compressed code is assigned by the algorithm similar to that at S203. The sort unit 144 sorts each piece of the character information to which the compressed code has been assigned, according to the value of the compressed code (S603). The controlling unit 141 then associates the code length of the assigned compressed code with each piece of the character information to which the compressed code has been assigned (S604).

The copying unit 143 then copies the character information and the information on the code length to the number based on the code length associated with the character information (S605). The controlling unit 141 then stores the copied information at the offset position based on the compressed code, which is also the position in the storage area of the decompression dictionary D3 secured by the storage unit 15 (S606). As a result of S606, the decompression dictionary D3 is generated and the procedure proceeds to S504 in FIG. 12.

FIG. 15 is an example of a data structure of a decompression dictionary. The decompression dictionary D3 has a data structure in which the information indicating the decompression code (character information) and the code length is stored in the offset position based on the corresponding compressed code. The decompression dictionary D3 in FIG. 15 is an example, when the maximum code length of the compressed codes is 12 bits.

The decompression dictionary D3 is used to read the fixed length data from the compressed data on which variable length coding is performed and extract the decompression code corresponding to the fixed length data that has been read. By reading the fixed length data, the decompression speed can be increased, compared with the case where the boundary between codes is determined one bit at a time. For the compressed codes shorter than 12 bits, extra data is read from the compressed data. Thus, the reading position from the compressed data is adjusted based on the code length. Because the decompression dictionary D3 is a decompression dictionary used for such decompression processing, pieces of information having the same decompression code and the code length are redundantly registered.

For example, the compressed code c([−Δ].) corresponding to the control symbol [−Δ] in the decompression dictionary D3 is 7-bit data of "0001011". This, however, is read collectively from the compressed data as 12-bit data. Out of the read 12-bit data, if the first 7 bits is "0001011", the decompression code of the control symbol [−Δ] can be obtained, whatever data the latter 5 bits may have. Thus, by storing all the values of the decompression codes and the code lengths that the latter 5 bits may have, information such as the decompression code corresponding to the 7-bit variable length code can be obtained, whatever data the latter 5 bits of the 12-bit fixed length data may have. The information on the control symbol [−Δ] is copied for all the ways (32) the latter 5 bits may have (from "00000" to "11111"). The compressed code is then stored in the offset position (000101100000(0x160)) corresponding to "0001011".

Similarly to the control symbol [−Δ], the symbol string aboutΔ is also copied as many as the number according to the code length of the compressed code, and stored in the offset position according to the compressed code. In the decompression dictionary D3, c(aboutΔ) is 10-bit data of "0110101001". Thus, information on the decompression code and the code length corresponding to the symbol string aboutΔ is copied for two to the second power (as a result of 12−10=2) ways, and stored in the offset position of "011010100100(0x6A4)".

FIG. 14 is an example of a procedure for generating decompressed data (S504). When the decompression dictionary D3 is generated, the controlling unit 121 starts generating decompressed data corresponding to the compressed data included in the compressed file F2. The reading position from the storage area A3 is set to the starting point of the compressed data in the compressed file F2, the writing position to the storage area A4 is set to a predetermined position in the storage area A4, and the storage area A5 (buffer) is cleared.

The reading unit 123 reads the compressed data from the reading position in the storage area A3 (S701). The compressed data is read in the fixed length as described above. The searching unit 122 refers to the decompression dictionary D3 based on the fixed length data that has been read (S702). The decompression code obtained by referring at S702 is stored in the storage area A5 (buffer). Subsequently, whether the decompression code in the storage area A5 is a combination of the control symbol and a delimiter is determined (S703). In the processing at S703, the determination may also be made based on whether the first character code in the decompression code is the control symbol.

If the decompression code in the storage area A5 is not a combination of the control symbol and a delimiter (No at S703), the writing unit 124 writes, at the writing position in the storage area A4, the decompression code obtained at S702 (S704).

If the decompression code in the storage area A5 is a combination of the control symbol and a delimiter (Yes at S703), the controlling unit 121 adjusts the writing position (S705). At S705, the controlling unit 121 moves the writing position in the storage area A4 back by one character code. Subsequently to S705, the writing unit writes, at the writing position in the storage area A4, the delimiter stored in the storage area A5 (S706).

When the processing at S704 or S706 is performed, the controlling unit 121 updates the reading position from the storage area A3 (S707). The reading position from the storage area A3 is updated based on the code length obtained by the reference at S702. The reading position is advanced as many as the number of bits indicating the code length information. The controlling unit 121 then updates the writing position to the storage area A4 (S708). The writing position to the storage area A4 is updated based on the decompression code length read at S702. The order of the processing at S707 and S708 may be interchanged.

Subsequently, the controlling unit 121 determines whether the reading position from the storage area A3 is the end of the compressed data in the compressed file F2 (S709). If the reading position from the storage area A3 is not the end of the compressed data (No at S709), the procedure returns to S701, and the reading unit 123 reads the compressed data again. If the reading position from the storage area A3 is the end of the compressed data (Yes at S709), the controlling unit 121 finishes the generation processing of decompressed data, and the procedure proceeds to S505.

As another example, the decompression dictionary D3 may also include information indicating decompression code lengths in addition to decompression codes and code lengths. In this case, for example, the controlling unit 121 updates the writing position, based on the decompression code lengths correlated with respective decompression codes in the processing at S708.

As still another example, the decompression dictionary D3 is an example of decompression dictionary, and a decompression dictionary in which the same information is not redundantly registered may also be used. For example, a decompression dictionary using the general Huffman coding may be used. Even in such a case, when a decompression code is obtained from the decompression dictionary, the controlling unit 121 performs the processing at S703, and based on the determination result, the controlling unit 121 performs either the processing at S704 or the processing at S705 and S706.

When the generation processing of decompressed data is finished, the controlling unit 121 generates the decompressed file F3 based on the decompressed data stored in the storage area A4, and stores the generated decompressed file F3 in the storage unit 15 (S505). The controlling unit 121 then notifies the calling destination of the decompression function that the decompression processing is finished (S506). The notification at S506, for example, includes information indicating the storage destination of the decompressed file F3. When the processing at S506 is finished, the decompression unit 12 finishes the decompression process.

[Description of Configuration]

The following describes a configuration for executing the above-described compression processing and the decompression processing.

Figure 16:
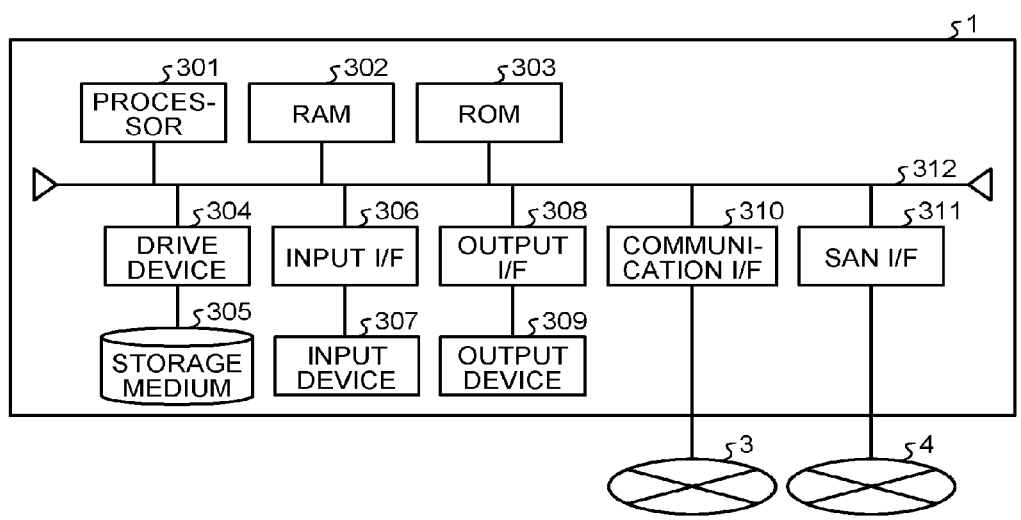
FIG. 16 is a configuration example of hardware in a computer 1.

FIG. 16 is a configuration example of hardware in the computer 1. The computer 1, for example, includes a processor 301, random access memory (RAM) 302, read only memory (ROM) 303, a drive device 304, storage medium 305, an input interface (I/F) 306, an input device 307, an output interface (I/F) 308, an output device 309, a communication interface (I/F) 310, a storage area network (SAN) interface (I/F) 311, and a bus 312. The pieces of hardware are connected to each other via the bus 312.

The RAM 302 is a readable and writeable memory device, and for example, semiconductor memory such as static RAM (SRAM) and dynamic RAM (DRAM), or flash memory and the like instead of the RAM may be used. The ROM 303 may be programmable ROM (PROM) and the like. The drive device 304 is a device that performs at least one of reading and writing of information recorded in the storage medium 305. The storage medium 305 stores therein information written by the drive device 304. The storage medium 305, for example, is storage medium such as a hard disk, flash memory such as a solid state drive (SSD), a compact disc (CD), a digital versatile disc (DVD), and a Blu-ray disc. For example, the computer 1 provides the drive device 304 and the storage medium 305 for each of a plurality of types of storage media.

The input interface 306 is connected to the input device 307, and is a circuit that transmits input signals received from the input device 307 to the processor 301. The output interface 308 is connected to the output device 309, and is a circuit that causes the output device 309 to output according to an instruction from the processor 301. The communication interface 310 is a circuit that controls the communication via a network 3. The communication interface 310, for example, is a network interface card (NIC). The SAN interface 311 is a circuit that controls the communication between the computer 1 and the connected storage device through a storage area network (SAN) 4. The SAN interface 311, for example, is a host bus adapter (HBA).

The input device 307 is a device that transmits input signals according to the operation. The input device, for example, is a keyboard, a key device such as a button mounted on the main body of the computer 1, and a pointing device such as a mouse and a touch panel. The output device 309 is a device that outputs information according to the control of the computer 1. The output device 309 is an image output device (display device) such as a display, and a speech output device such as a speaker. For example, an input/output device such as a touch screen may be used as the input device 307 and the output device 309. The input device 307 and the output device 309 may be integrated with the computer 1, or may be a device not included in the computer 1, but for example, connected to the computer 1 from outside in a wired or wireless manner.

For example, the processor 301 reads a computer program stored in the ROM 303 and the storage medium 305 to the RAM 302, and performs at least one of processes by the compression unit 11, the decompression unit 12, the generation unit 13, and the generation unit 14, according to the procedure of the read program. In such case, the RAM 302 is used as a work area of the processor 301. The functions of the storage unit 15 are achieved, when the ROM 303 and the storage medium 305 store program files (such as an application program 24, middleware 23, and an operation system (OS) 22, which will be described later) and data files (such as the file F1, the compressed file F2, and the decompressed file F3) therein, and when the RAM 302 is used as a work area of the processor 301. The computer programs to be read by the processor 301 are described by referring to FIG. 17.

Figure 17:
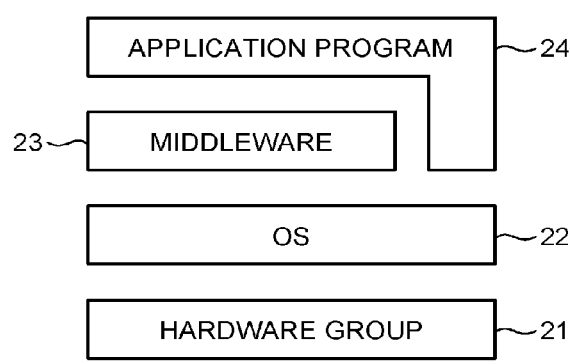
FIG. 17 is a configuration example of computer programs to be operated in the computer 1.

FIG. 17 is a configuration example of computer programs operated in the computer 1. The application program 24 or the middleware 23 is a computer program in which the procedure for performing the compression function or the decompression function of the present embodiment is prescribed. In other words, the application program 24 or the middleware 23 is a computer program in which the procedure for generating the compression dictionary or the decompression dictionary of the present embodiment is prescribed.

The compression program in which the procedure for performing the compression function is prescribed and the decompression program in which the procedure for performing the decompression function is prescribed may be integrated with each other or separate programs. The compression dictionary generation program, in which the procedure for generating the compression dictionary is prescribed, may be included in a compression program or a separate program called by the compression program. The decompression dictionary generation program, in which the procedure for generating a decompression dictionary is prescribed, may be included in the decompression program or a separate program read by the decompression program. At least one of the compression function and the decompression function of the present embodiment may be provided as one function of the OS 22.

For example, at least one of the compression function and the decompression function, and at least one of the compression program, the decompression program, the compression dictionary generation program, and the decompression dictionary generation program described above are stored in the storage medium. For example, a computer program stored in the storage medium becomes executable, when the program stored in the storage medium is read by the drive device 304 and is installed. Each of the procedures prescribed in the installed program is executed when a hardware group 21 (301 to 312) is controlled based on the OS 22.

The function of each of the functional blocks included in the computer 1 illustrated in FIG. 4, is provided when the processor 301 executes the compression program or the decompression program. The function of each functional block included in the compression unit 11 and the generation unit 13 is provided, when the processor 301 executes each procedure illustrated in FIG. 5, FIG. 6, FIG. 7, FIG. 9, and FIG. 10. The function of each functional block included in the decompression unit 12 and the generation unit 14 is provided, when the processor 301 executes the procedure illustrated in FIG. 12, FIG. 13, and FIG. 14.

For example, the functional blocks in the compression unit 11 are executed by using the hardware group 21 as follows. The function of the controlling unit 111 is provided, when the processor 301 accesses the RAM 302 (such as securing a storage area and loading a file), manages the processing status (such as the reading position and the writing position) in the register, and performs matching determination on the information held in the register. The function of the reading unit 113 is provided when the processor 301 accesses the RAM 302 according to the processing status in the register. The function of the searching unit 112 is provided when the processor 301 accesses the RAM 302 and performs collation determination based on the results of the access. The function of the writing unit 114 is provided when the processor 301 accesses the RAM 302 according to the processing status in the register.

For example, the functional blocks in the decompression unit 12 are executed by using the hardware group 21 as follows. The function of the controlling unit 121 is provided when the processor 301 accesses the RAM 302 (such as securing a storage area and loading a file), manages the processing status (such as the reading position and the writing position) in the register, and performs matching determination on the information held in the register. The function of the reading unit 123 is provided when the processor 301 accesses the RAM 302 according to the processing status in the register. The function of the searching unit 122 is provided, when the processor 301 accesses the RAM 302 and performs collation determination based on the results of the access. The function of the writing unit 124 is provided when the processor 301 accesses the RAM 302 according to the processing status in the register.

For example, the functional blocks in the generation unit 13 are executed by using the hardware group 21 as follows. The function of the controlling unit 131 is provided when the processor 301 manages the area of the RAM 302, accesses the RAM 302, and calls the routine according to the results of the routine. The function of the statistical unit 132 is provided when the processor 301 accesses the RAM 302 and performs arithmetic processing based on the results of the access. The function of the sort unit 134 is provided when the processor 301 accesses the RAM 302, and performs arithmetic processing based on the results of the access. The function of the assignment unit 133 is provided when the processor 301 performs arithmetic processing based on the access to the RAM 302.

For example, the functional blocks in the generation unit 14 are executed by using the hardware group 21 as follows. The function of the controlling unit 141 is provided when the processor 301 manages the area of the RAM 302, accesses the RAM 302, and calls the routine according to the results of the routine. The function of the copying unit 143 is provided when the processor 301 accesses the RAM 302. The function of the sort unit 144 is provided when the processor 301 accesses the RAM 302, and performs arithmetic processing based on the results of the access. The function of the assignment unit 142 is provided when the processor 301 performs arithmetic processing based on the access to the RAM 302.

According to the present embodiment, because one compressed code is assigned to a symbol string and a space symbol, the number of compressed codes is reduced. Consequently, the frequency of access to the memory needed to write compressed codes is reduced. The compression ratio is also improved, reducing the input/output (I/O) rate to store compressed files.

Figure 18:
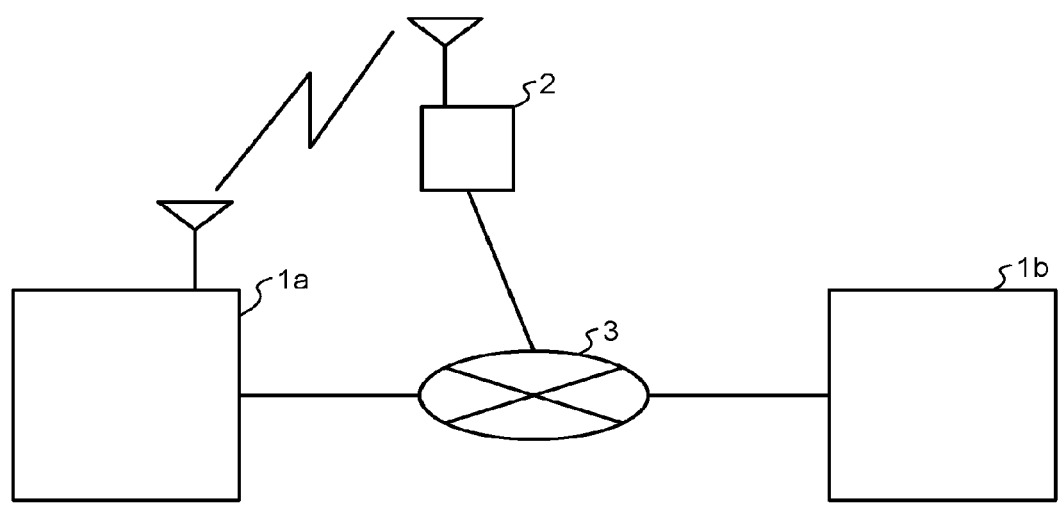
FIG. 18 is a configuration example of a system using the computer 1.

FIG. 18 is a configuration example of a system using the computer 1. The information processing system illustrated in FIG. 18 includes a base station 2, the network 3, a computer 1a, and a computer 1b. The computer 1a is connected to the network 3, which is connected to the computer 1b, by at least one of the wired and wireless manners. Only the computer 1a may include the compression unit 11, the decompression unit 12, the generation unit 13, and the generation unit 14 illustrated in FIG. 4. Both the computer 1a and the computer 1b may otherwise include the compression unit 11, the decompression unit 12, the generation unit 13, and the generation unit 14 illustrated in FIG. 4. The computer 1a may include the compression unit 11 and the generation unit 13, and the computer 1b may include the decompression unit 12 and the generation unit 14. Conversely, the computer 1b may include the compression unit 11 and the generation unit 13, and the computer 1a may include the decompression unit 12 and the generation unit 14.

For example, the compressed file F2 generated in the computer 1a is transmitted to the computer 1b through communication via the network 3. The decompressed file F3 is generated when the computer 1b decompresses the compressed file F2. The compressed file F2 may be transmitted to the base station 2 wirelessly, and transmitted to the computer 1b from the base station 2.

The compression function and the decompression function according to the present embodiment improve the compression ratio, reducing the amount of compressed data to be transmitted. As a result, the usage of the hardware resource in the system illustrated in FIG. 18 relative to the communication process is reduced.

Figure 19:
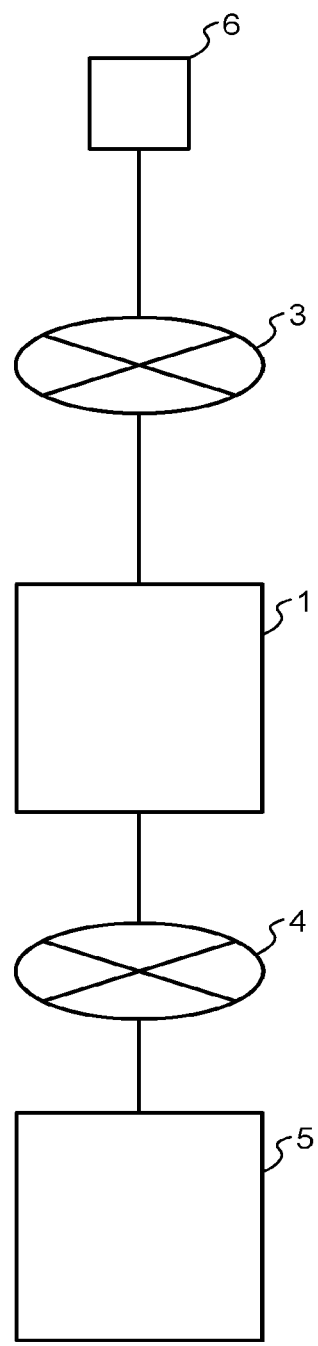
FIG. 19 is a configuration example of a system using the computer 1.

FIG. 19 is a configuration example of a system using the computer 1. The information processing system illustrated in FIG. 19 includes the computer 1, the network 3, a client device 6, the SAN 4, and a storage device 5. For example, the computer 1 performs information processing according to the request from the client device 6. The data on which information processing is to be performed, for example, is compressed and stored in the storage device 5. On receiving a request from the client device 6, the computer 1 obtains the data on which information processing has been performed, which is compressed and stored in the storage device 5, and decompresses it. The computer 1 executes the information processing requested from the client device 6 on the decompressed data, compresses the data on which information processing has been performed, and stores it in the storage device 5. The information processing, for example, includes update of data stored in the storage device 5 and analysis of data stored in the storage device 5.

In the system illustrated in FIG. 19, the compression processing or the decompression processing may be executed by retaining a compression dictionary and a decompression dictionary once created, and executing the processing based on the compression dictionary and the decompression dictionary, instead of generating a compression dictionary and a decompression dictionary every time the compression processing and decompression processing are performed. In this case, the processing at S103 in FIG. 5 and the processing at S503 in FIG. 12 may be performed, by simply loading the compression dictionary and the decompression dictionary being retained.

In the system illustrated in FIG. 19, the data is decompressed every time the request of information processing is received. When the decompression processing takes time, the time to respond to the request is also increased. When the compression function according to the present embodiment improves the compression ratio, the I/O rate of compressed data to and from the storage device 5. Because the number of compressed codes is small, the number of times of memory access during decompression is also prevented from increasing. The storage area to be secured for loading the compressed file F2 is also reduced.

[Description of Modification]

The following describes a part of a modification according to the present embodiment.

The target for compression processing may be a monitor message output from a system, instead of a file. For example, a monitor message sequentially stored in the buffer may be compressed by the compression processing described above, and is processed by storing it as a log file or the like. For example, the compression may be performed in a unit of a page in the database, or the compression may be performed in a unit of a plurality of pages. The common compression dictionary may be used for the monitor messages, and the common compression dictionary may be used for the plurality of pages.

While a space symbol is often used in document data, other delimiters are also used. When the compression dictionary D2 is used, the following three types of compressed codes are used for symbol strings to which a delimiter is given, delimiters, and the space symbol: a compressed code corresponding to a combination of a symbol string and the space symbol, a compressed code corresponding to the control symbol and delimiters, and a compressed code corresponding to the space symbol. When a delimiter other than the space symbol is used, however, the space symbol is often used following the delimiter. A compression dictionary D4 in which compressed codes are assigned to combinations of the control symbol, a delimiter (other than the space symbol), and the space symbol may be used in place of the compression dictionary D2.

FIG. 20 is an example of a data structure of a compression dictionary. Combinations of control symbols and delimiters (other than the space symbol) are registered on the compression dictionary D4. In contrast to this, combinations of control symbols, delimiters (other than the space symbol), and space symbols are registered on the compression dictionary D4 illustrated in FIG. 20. In the processing of counting the control symbol at S306 in FIG. 7, whether a space symbol follows a delimiter (other than the space symbol) is checked. If a space symbol follows, once a combination of the control symbol, a delimiter (other than the space symbol), and the space symbol are registered, the compression dictionary D4 in FIG. 20 is generated.

FIG. 21 is an example of a data structure of a decompression dictionary. Combinations of control symbols, delimiters (other than the space symbol), and space symbols are registered also in FIG. 21. Once the statistical table T1 is generated according to the procedure described for FIG. 20, a decompression dictionary D5 is generated according to the statistical table. The decompression dictionary D5 is used in place of the decompression dictionary D3.

In document data, boundaries between linguistic units, such as words, which are constituent elements of the document data, are represented by space symbols. In contrast to this, in CSV (comma-separated values) data, breaks between fields that are constituent elements of the CSV data are represented by commas included in the data sequence. When the above-described compression algorithms are used for CSV files, compressed codes corresponding to commas are used repeatedly between each piece of data, making it harder for the compression ratio to be improved.

FIG. 22 is an example of a data structure in CSV format. CSV data E1 illustrated in FIG. 22 is data including six fields in each line. Titles of respective fields (application number, application date, inventor, country name, route, and title of the invention) are indicated in the header line. Breaks between lines are represented by line feed codes. Data in the inventor field in the data E1 indicates surnames and first names of inventors, and the surnames and first names are each separated by a space symbol.

FIG. 23 is an example of a data structure of a compression dictionary. Combinations of symbol strings and commas are registered on a compression dictionary D6 illustrated in FIG. 23. Character information in which a comma is appended to a word, such as "INDEX," and "INFORMATION," is registered. While the compression dictionary D6 in which character information including a comma at the end thereof is registered is used, delimiters other than the comma follow words in the data E1. Thus, a control symbol [–,] is used for deleting the immediately preceding comma. For example, the combination of the control symbol [–,] and the space symbol Δ is registered on the compression dictionary D6. For example, the combination of the control symbol [–,] and a line feed code (line feed code is illustrated as [LF]) is also registered on the compression dictionary D6. A compressed code corresponding to each piece of character information registered is correlated with the piece of character information and stored in the compression dictionary D6.

FIG. 24 is an example of a data structure of a decompression dictionary. In a decompression dictionary D7 illustrated in FIG. 24, each piece of character information registered on the compression dictionary D6 is copied as many as the number according to the code length of the corresponding compressed code, and stored in the offset position according to the corresponding compressed code. Information indicating the code length of the compressed code is also correlated with each piece of character information and stored in the decompression dictionary D7.

While elements of data are separated by commas in CSV data, line feed codes are used between lines. Consequently, the combination of the control symbol [–,] and the line feed code appears frequently, for example, causing the code length of the compressed code to be shorter.

When a plurality of words are included in a field, a space symbol may be included. For example, the data in the inventor field in the data E1 illustrated in FIG. 22 is "KATAOKAΔMASAHIRO," the compressed code corresponding to which is c(KATAOKA,)c([–,]Δ)c(MASAHIRO,).

When CSV data is handled, whether the delimiter is a comma is determined at S304 in FIG. 7. Furthermore, whether the character code read at S401 is a comma is determined at S403 in FIG. 9. Character information in which the last delimiter is replaced with a comma is generated in the processing at S410 in FIG. 10.

Meanwhile, because compressed data is generated such that the control symbol occurs at the position of the delimiter other than the comma in decompression processing, CSV data can be processed according to the procedure in FIG. 14.

While the above embodiment describes the control symbol [–Δ] for deleting the immediately preceding space symbol and the control symbol [–,] for deleting the immediately preceding comma, a control symbol for moving the reading position back by one character code (one byte) may be simply used. In this case, a compression dictionary supporting symbol strings similar to those in the symbol string compression dictionary D12 may be provided for a plurality of types of delimiters. For example, both a symbol string compression dictionary supporting combinations of words and space symbols and a symbol string compression dictionary supporting combinations of words and space symbols are used.

In the above embodiment, combinations of a symbol string, such as a word, and the immediately preceding delimiter, such as a space symbol, may be registered on a compression dictionary. In this case, a control symbol for deleting a space symbol that follows is used, for example.

In addition to the above modification, the design can be modified as appropriate within the scope not departing from the spirit of the present invention.

According to an aspect of the present invention, the compression efficiency of document data in which a space symbol is used can be improved.

All examples and conditional language provided herein are intended for the pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compression device comprising:
   a processor configured to:
   store, in a storage, a first compressed code in association with a first element, the first compressed code corresponding to a combination of a first element and a first delimiter, the first element being one of a plurality of elements constituting input data, the first delimiter being one of delimiters delimiting the plurality of elements and succeeding the first element in the input data;
   acquire, from the storage, the first compressed code in response to reading a sequence of the first element and the first delimiter from the input data; and
   write the first compressed code into a storage area that stores therein compressed data of the input data.

2. The compression device according to claim 1, wherein the processor is further configured to:
   store, in the storage, a first control code corresponding to a combination of a control symbol indicating an instruction to delete the first delimiter and the first delimiter,
   acquire, from the storage, the first compressed code and the first control code in response to reading the first element from the input data, and
   write the first control code at a position following the first compressed code in the storage area.

3. The compression device according to claim 1, wherein the processor is further configured to:

store, in the storage, a second control code corresponding to a combination of a control symbol indicating an instruction to delete the first delimiter and a second delimiter that is a delimiter delimiting the plurality of elements respectively and differs from the first delimiter, in association with the second delimiter, acquire, from the storage, the first compressed code and the second control code in response to reading a sequence of the first element and the second delimiter from the input data, and write the second control code at a position following the first compressed code in the storage area.

4. The compression device according to claim 1, wherein the input data is a text file, and the elements are data in units of words.

5. The compression device according to claim 1, wherein the input data is a text file supporting a table structure, and the elements constitute one field in the table structure.

6. A compression method comprising:

acquiring, from a storage device that stores therein a first compressed code in association with a first element, the first compressed code corresponding to a combination of a first element and a first delimiter, the first element being one of a plurality of elements constituting input data, the first delimiter being one of delimiters delimiting the plurality of elements and succeeding the first element in the input data, by a processor; and writing the first compressed code into a storage area that stores therein compressed data of the input data, by the processor.

7. A non-transitory computer-readable recording medium storing a compression program that causes a computer to execute a process comprising:

acquiring, from a storage device that stores therein a first compressed code in association with a first element, the first compressed code corresponding to a combination of a first element and a first delimiter, the first element being one of a plurality of elements constituting input data, the first delimiter being one of delimiters delimiting the plurality of elements and succeeding the first element in the input data; and writing the first compressed code into a storage area that stores therein compressed data of the input data.

8. A decompression device comprising:

a processor configured to:

store, in a storage, a combination of a first element, which is one of elements constituting data, and a first delimiter representing a break between the elements in the data, in association with one compressed code;

acquire, from the storage, the combination corresponding to the compressed code read from compressed data that is obtained by compressing the data; and write both the first element and the first delimiter included in the acquired combination, into a storage area for decompressed data that is obtained by decompressing the compressed data.

9. The decompression device according to claim 8, wherein the processor is further configured to:

store, in the storage, a combination of a control symbol indicating an instruction to negate the delimiter and a second delimiter that is a delimiter representing a break between the elements in the data and differs in type from the first delimiter, in association with another compressed code different from the compressed code, acquire, when reading the other compressed code that follows the compressed code from the compressed data, the control symbol and the second delimiter after the first element and the first delimiter, from the storage, and write the acquired second delimiter at a storage position of the first delimiter in the storage area, once the control symbol and the second delimiter are acquired.

10. The decompression device according to claim 9, wherein in addition to the control symbol and the second delimiter, the first delimiter is included in a combination associated with the other compressed code.

11. The decompression device according to claim 8. wherein the data is a text file, and the elements are data in units of words.

12. The decompression device according to claim 8, wherein the data is a text file supporting a table structure, and the elements constitute one field in the table structure.

13. A decompression method comprising:

acquiring, from a storage device that stores therein a combination of a first element, which is one of elements constituting data, and a first delimiter representing a break between the elements in the data, in association with one compressed code, the combination corresponding to the compressed code read from compressed data that is obtained by compressing the data, by a processor; and writing both the first element and the first delimiter included in the acquired combination, into a storage area for decompressed data that is obtained by decompressing the compressed data, by the processor.

14. A non-transitory computer-readable recording medium storing a decompression program that causes a computer to execute a process comprising:

acquiring, from a storage device that stores therein a combination of a first element, which is one of elements constituting data, and a first delimiter representing a break between the elements in the data, in association with one compressed code, the combination corresponding to the compressed code read from compressed data that is obtained by compressing the data; and writing both the first element and the first delimiter included in the acquired combination, into a storage area for decompressed data that is obtained by decompressing the compressed data.

15. An information processing system comprising:

a storage device; and an information processing device including:

a processor configured to:

store, in a storage, a conversion dictionary in which a combination of a first element, which is one of elements constituting data, and a delimiter representing a break between the elements in the data is associated with one compressed code;

receive, from the storage device, compressed data that is obtained by compressing data;

first acquire, from the conversion dictionary, the combination corresponding to the compressed code read from the compressed data;

first write both the first element and the delimiter included in the acquired combination, into a first storage area for decompressed data that is obtained by decompressing the compressed data;

perform information processing on the decompressed data written into the first storage area;

second acquire, from the conversion dictionary, the compressed code stored in association with the first element read from the decompressed data on which the information processing has been performed;

first write the acquired compressed code into a second storage area that stores therein compressed data of the data; and transmit, to the storage, the compressed data written in the second storage area.

16. A non-transitory computer-readable recording medium that stores therein:

compression dictionary data having a structure that includes, for each type of data elements, information for compression processing in which one compressed code corresponding to a combination of a delimiter representing a break between elements in data and one data element separated by the delimiter is associated with the data element, wherein the compression dictionary data is such that the one compressed code is referred to based on the one data element in compression processing by a computer.

17. A non-transitory computer-readable recording medium that stores therein:

decompression dictionary data having a structure that includes, for each type of data elements, information for decompression processing in which a combination of a delimiter representing a break between elements in data and one data element separated by the delimiter is associated with one compressed code corresponding to the combination, wherein the decompression dictionary data is such that the combination is referred to based on the one compressed code in decompression processing by a computer.

18. The non-transitory computer-readable recording medium according to claim 7, wherein the acquiring includes storing, in the storage device, a first control code corresponding to a combination of a control symbol indicating an instruction to delete the first delimiter and the first delimiter, and acquiring, from the storage device, the first compressed code and the first control code in response to reading the first element from the input data, and the writing includes writing the first control code at a position following the first compressed code in the storage area.

19. The non-transitory computer-readable recording medium according to claim 7, wherein the acquiring includes storing, in the storage device, a second control code corresponding to a combination of a control symbol indicating an instruction to delete the first delimiter and a second delimiter that is a delimiter delimiting the plurality of elements respectively and differs from the first delimiter, in association with the second delimiter, and acquiring, from the storage device, the first compressed code and the second control code in response to reading a sequence of the first element and the second delimiter from the input data, and the writing includes writing the second control code at a position following the first compressed code in the storage area.

20. The non-transitory computer-readable recording medium according to claim 7, wherein the input data is a text file, and the elements are data in units of words.

21. The non-transitory computer-readable recording medium according to claim 7, wherein the input data is a text file supporting a table structure, and the elements constitute one field in the table structure.

22. The non-transitory computer-readable recording medium according to claim 14, wherein the acquiring includes storing, in the storage, a combination of a control symbol indicating an instruction to negate the delimiter and a second delimiter that is a delimiter representing a break between the elements in the data and differs in type from the first delimiter, in association with another compressed code different from the compressed code, and acquiring, when reading the other compressed code that follows the compressed code from the compressed data, the control symbol and the second delimiter after the first element and the first delimiter, from the storage, and the writing includes writing the acquired second delimiter at a storage position of the first delimiter in the storage area, once the control symbol and the second delimiter are acquired.

23. The non-transitory computer-readable recording medium according to claim 22, wherein in addition to the control symbol and the second delimiter, the first delimiter is included in a combination associated with the other compressed code.

24. The non-transitory computer-readable recording medium according to claim 14, wherein the data is a text file, and the elements are data in units of words.

25. The non-transitory computer-readable recording medium according to claim 14, wherein the data is a text file supporting a table structure, and the elements constitute one field in the table structure.

* * * * *